(12) United States Patent
Kaiser et al.

(10) Patent No.: US 11,770,659 B2
(45) Date of Patent: Sep. 26, 2023

(54) MEMS DEVICE, ASSEMBLY COMPRISING THE MEMS DEVICE, AND METHOD OF OPERATING THE MEMS DEVICE

(71) Applicant: Fraunhofer-Gesellschaft zur Förderung der angewandten Forschung e.V., Munich (DE)

(72) Inventors: Bert Kaiser, Dresden (DE); Jorge Mario Monsalve Guaracao, Dresden (DE); Holger Conrad, Dresden (DE)

(73) Assignee: Fraunhofer-Gesellschaft zur Förderung der angewandten Forschung e. V., Munich (DE)

( * ) Notice: Subject to any disclaimer, the term of this patent is extended or adjusted under 35 U.S.C. 154(b) by 26 days.

(21) Appl. No.: 17/753,031

(22) PCT Filed: Jul. 28, 2020

(86) PCT No.: PCT/EP2020/071256
§ 371 (c)(1),
(2) Date: Feb. 16, 2022

(87) PCT Pub. No.: WO2021/032417
PCT Pub. Date: Feb. 25, 2021

(65) Prior Publication Data
US 2022/0286785 A1 Sep. 8, 2022

(30) Foreign Application Priority Data
Aug. 16, 2019 (EP) ..................................... 19192135

(51) Int. Cl.
*H04R 11/02* (2006.01)
*H04R 19/00* (2006.01)
(Continued)

(52) U.S. Cl.
CPC ............. *H04R 19/00* (2013.01); *B81B 3/007* (2013.01); *H04R 3/00* (2013.01);
(Continued)

(58) Field of Classification Search
CPC ............................. H04R 19/013; H04R 11/02
(Continued)

(56) References Cited

U.S. PATENT DOCUMENTS

2013/0243234 A1 9/2013 Zoellin et al.
2015/0078590 A1 3/2015 Daley et al.
2018/0194615 A1 7/2018 Nawaz et al.

FOREIGN PATENT DOCUMENTS

WO 201709298 A1 5/2017

*Primary Examiner* — George C Monikang
(74) *Attorney, Agent, or Firm* — 2SPL Patentanwälte PartG mbB; Kieran O'Leary

(57) ABSTRACT

Proposed is a MEMS device comprising a layer stack having at least one second layer formed between a first layer and a third layer. A cavity is formed in the second layer. The MEMS device further comprises two laterally deflectable elements arranged laterally spaced apart in the cavity. Each of the two laterally deflectable elements comprises a respective end connected to a side wall of the cavity. Additionally, the MEMS device comprises a connecting element connected to the two laterally deflectable elements to couple the movement of the two laterally deflectable elements. A plurality of first fingers are arranged discretely spaced between the two laterally deflectable elements on the side wall of the cavity. Further, a plurality of second fingers are arranged discretely spaced between the two laterally deflectable elements on the connecting element. The plurality of second fingers interdigitate with the plurality of first fingers. Further, the plurality of second fingers are laterally displaceable relative to the plurality of first fingers upon deformation of the two laterally deflectable elements such that the plurality of first fingers and the plurality of second fingers
(Continued)

define a plurality of volume variable sub-cavities within the cavity. Each of the plurality of sub-cavities is in contact with an ambient fluid of the MEMS device via a respective opening. In case of adjacent sub-cavities of the plurality of sub-cavities, the respective opening of one sub-cavity of the adjacent sub-cavities is formed in a different layer of the first layer, the second layer and the third layer than the opening of the other sub-cavity of the adjacent sub-cavities.

22 Claims, 16 Drawing Sheets

(51) Int. Cl.
     *B81B 3/00*        (2006.01)
     *H04R 3/00*       (2006.01)

(52) U.S. Cl.
     CPC ............... *B81B 2201/0257* (2013.01); *B81B 2203/0136* (2013.01); *B81B 2203/04* (2013.01); *H04R 2201/003* (2013.01)

(58) Field of Classification Search
     USPC ................................................ 381/116–117
     See application file for complete search history.

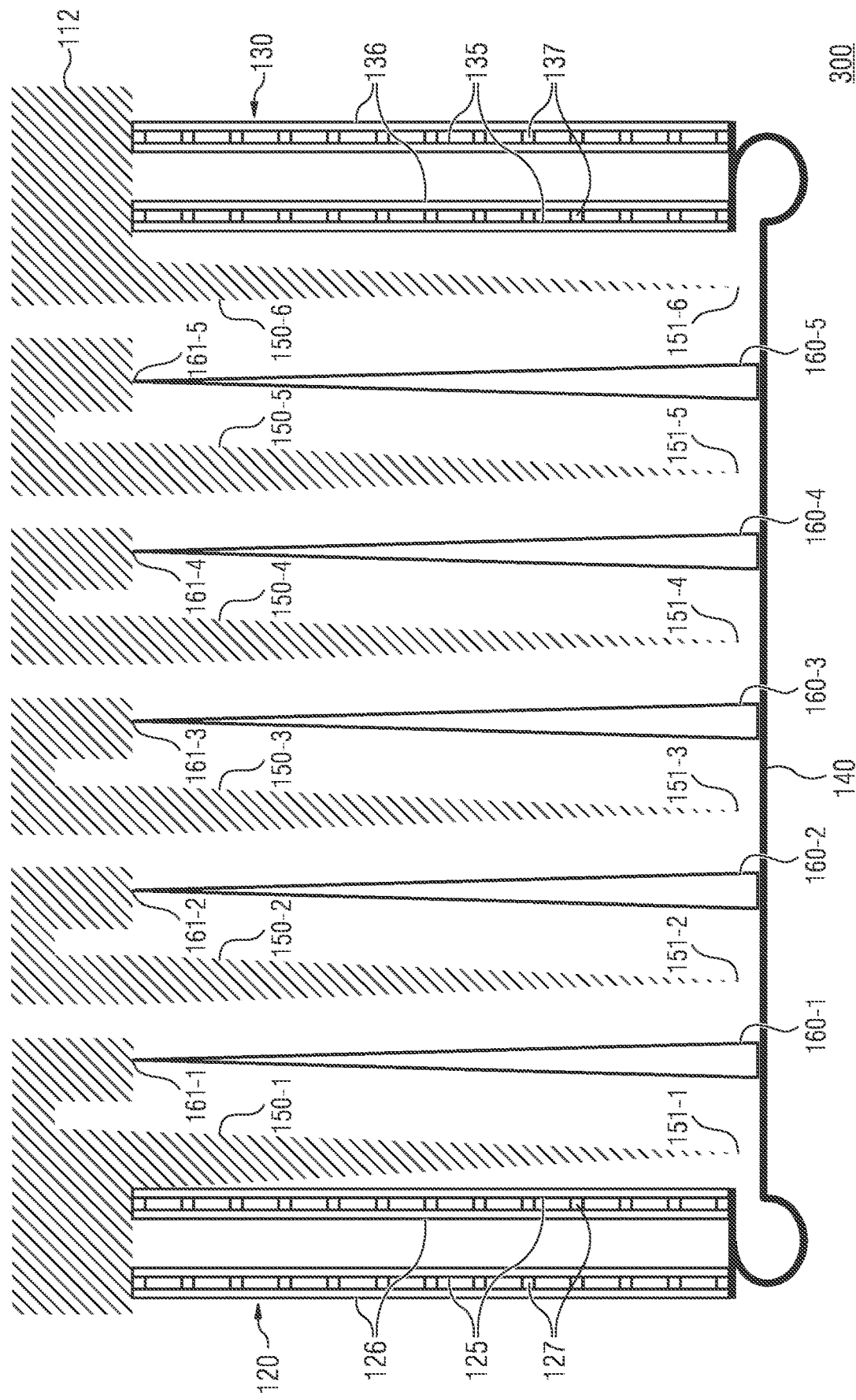

MEMS DEVICE, ASSEMBLY COMPRISING THE MEMS DEVICE, AND METHOD OF OPERATING THE MEMS DEVICE

CROSS-REFERENCE TO RELATED APPLICATIONS

This application is a 35 U.S.C. § 371(c) national stage entry of PCT/EP2020/071256, filed on Jul. 28, 2020. That application claimed priority to European Application 19192135.2 filed on Aug. 16, 2019. The contents of the earlier filed applications are incorporated by reference herein in their entirety.

TECHNICAL AREA

The present disclosure relates to MicroElectroMechanical Systems (MEMS) devices. In particular, embodiments relate to a MEMS device, an assembly comprising the MEMS device, and methods of operating the MEMS device.

BACKGROUND

MEMS devices can be used in many ways to interact with a gas or liquid in the environment. For example, MEMS devices can be used to excite a gas in the environment to vibrate. Such MEMS devices can be used for loudspeakers, for example. MEMS devices can also be used to detect vibrations of a gas in the environment. Such MEMS devices can be used for microphones, for example.

For example, documents US 2018/194615 A1 and US 2018/290883 A1 propose interlocking structures that are deflectable by means of an applied potential to introduce a force into a membrane so that the membrane undergoes deflection. The comb-like drive structures are arranged around the diaphragm. The comb-like drive structures are designed as active actuators that move out-of-plane to cause the membrane to vibrate.

An in-plane movement of a passive element driven by micromechanical actuators is proposed in document DE 10 2017 206 766 A1. In this case, deflectable elements are connected to a surrounding substrate on opposite sides. The respective freely movable ends are connected to plates via spring elements or rigid elements and can thus transmit forces to the plate. At least two such plates are arranged opposite each other and laterally close off a cavity that is connected to the surroundings through an opening in the substrate. The disadvantage of this is that the plates are not suitable for sufficiently large volumes.

A comb-like structure that serves to move micromirrors and moves in the plane is proposed in document DE 10 2008 049 647 A1. The comb-finger-like drive components are flexibly connected to a movable functional element. The functional element can thus be deformed by the drive components. Alternatively, the deformations of the functional element can be measured. The movement of the electrodes takes place in the plane. The disadvantage of this is that high capacities are required for the deflection.

Document DE 10 2017 220 412 A1 further proposes a sensor formed by electrodes arranged in a comb-like manner. Here, first electrodes are connected to a ground and second electrodes are connected to a surrounding substrate. The electrodes overlap in an undeflected state by less than 35%, but preferably by less than 25%. The movement of the electrodes is out of the plane.

It would be desirable to have a MEMS element that allows an increase in the effective area of the MEMS element to interact with a surrounding fluid (ambient fluid). Furthermore, movements for interaction with the ambient fluid should be in-plane, i.e., in-plane.

With this in mind, one task is to provide an improved MEMS structure for interaction with an ambient fluid.

SUMMARY

According to the invention, the task is solved by a MEMS device, an assembly comprising the MEMS device, and methods for operating the MEMS device according to the independent claims. Further aspects as well as further embodiments of the invention are described in the dependent claims, the following description as well as in the figures.

A first embodiment relates to a MEMS device comprising a layer stack having at least one second layer formed between a first layer and a third layer. A cavity is formed in the second layer. The MEMS device further comprises two laterally deflectable elements arranged laterally spaced apart in the cavity. Each of the two laterally deflectable elements comprises a respective end connected to a side wall of the cavity. Additionally, the MEMS device comprises a connecting element connected to the two laterally deflectable elements to couple the movement of the two laterally deflectable elements. A plurality of first fingers are arranged discretely spaced between the two laterally deflectable elements on the side wall of the cavity. Further, a plurality of second fingers are arranged discretely spaced between the two laterally deflectable elements on the connecting element. The plurality of second fingers interdigitate with the plurality of first fingers. Further, the plurality of second fingers are laterally displaceable relative to the plurality of first fingers upon deformation of the two laterally deflectable elements such that the plurality of first fingers and the plurality of second fingers define a plurality of volume variable sub-cavities within the cavity. Each of the plurality of sub-cavities is in contact with an ambient fluid of the MEMS device via a respective opening. In case of adjacent sub-cavities of the plurality of sub-cavities, the respective opening of one sub-cavity of the adjacent sub-cavities is formed in a different layer of the first layer, the second layer and the third layer than the opening of the other sub-cavity of the adjacent sub-cavities.

Further, a second embodiment relates to an assembly comprising a plurality of MEMS devices as described herein. In addition, the assembly comprises a control circuit configured to provide at least a first potential to the laterally deflectable elements of at least a portion of the plurality of MEMS devices to operate the respective laterally deflectable elements as actuators to affect the ambient fluid. Alternatively or additionally, the assembly comprises a measurement circuit configured to measure second potentials of the respective laterally deflectable elements of at least a portion of the plurality of MEMS devices to operate the respective laterally deflectable elements as sensors for the ambient fluid.

A third embodiment relates to a first method of operating a MEMS device as described herein. The method comprises laterally deforming the two laterally deflectable elements in a first direction by applying a potential to increase a volume of the one sub-cavity of the adjacent sub-cavities and decrease a volume of the other sub-cavity of the adjacent sub-cavities during a first time interval for influencing the ambient fluid. Further, the method comprises laterally deforming the two laterally deflectable elements in an opposite second direction by applying the potential to increase the volume of the one sub-cavity of the adjacent sub-cavities and decrease the volume of the other sub-cavity of the adjacent sub-cavities during a second time interval for influencing the ambient fluid.

Further, a fourth embodiment relates to a second method of operating a MEMS device as described herein, wherein the plurality of second fingers are laterally displaceable relative to the plurality of first fingers to adjust volumes of the adjacent sub-cavities depending on the ambient fluid by lateral deformation of the two laterally displaceable elements. The method comprises outputting a respective potential by the two laterally deflectable elements in case of lateral deformation due to the external force exerted by the displacement of the plurality of second fingers.

The sub-cavities formed between the first and second fingers provide a large area for interaction with the ambient fluid. In this context, the MEMS device can be used both to influence the ambient fluid, i.e., as an actuator, and to measure the ambient fluid, i.e., as a sensor. The available area of the MEMS device can thus be used to a high degree for interaction with the ambient fluid. In addition, the comb-like arrangements of the first and second fingers allow only a comparatively small (unwanted) electrical capacitance loading to occur.

FIGURE SHORT DESCRIPTION

Some examples of apparatuses and/or methods will be described in the following by way of example only, and with reference to the accompanying figures, in which FIG. 1 illustrates a top view of a first embodiment of a MEMS device;

FIG. 3 illustrates a top view of a second embodiment of a MEMS device;

DESCRIPTION

Various examples are now described in more detail with reference to the accompanying figures, in which some examples are shown. In the figures, the thicknesses of lines, layers, and/or areas may be exaggerated for clarity.

Accordingly, while further examples of various modifications and alternative forms are suitable, some specific examples thereof are shown in the figures and are described in detail below. However, this detailed description does not limit further examples to the particular forms described. Other examples may cover any modifications, correspondences, and alternatives that fall within the scope of the revelation. Throughout the description of the figures, the same or similar reference signs refer to the same or similar elements that, when compared to each other, may be identical or implemented in a modified form while providing the same or similar function.

It is understood that when an element is described as being "connected" or "coupled" to another element, the elements may be connected or coupled directly, or through one or more intermediate elements. When two elements A and B are combined using an "or", this is to be understood as disclosing all possible combinations, i.e., only A, only B, and A and B, unless explicitly or implicitly defined otherwise. An alternative wording for the same combinations is "at least one of A and B" or "A and/or B". The same applies, mutatis mutandis, to combinations of more than two elements.

The terminology used here to describe specific examples is not intended to be limiting for further examples. If a singular form, e.g., "one, one" and "the, the, the" is used and the use of only a single element is neither explicitly nor implicitly defined as mandatory, further examples may also use plural elements to implement the same function. If a function is described below as being implemented using multiple elements, further examples may implement the same function using a single element or processing entity. It is further understood that the terms "includes," "comprising," "having," and/or "comprising," when used, specify the presence of the specified features, integers, steps, operations, processes, elements, components, and/or a group thereof, but do not exclude the presence or addition of one or more other features, integers, steps, operations, processes, elements, components, and/or a group thereof.

Unless otherwise defined, all terms (including technical and scientific terms) are used herein in their ordinary meaning in the field to which examples belong.

Figure 1:
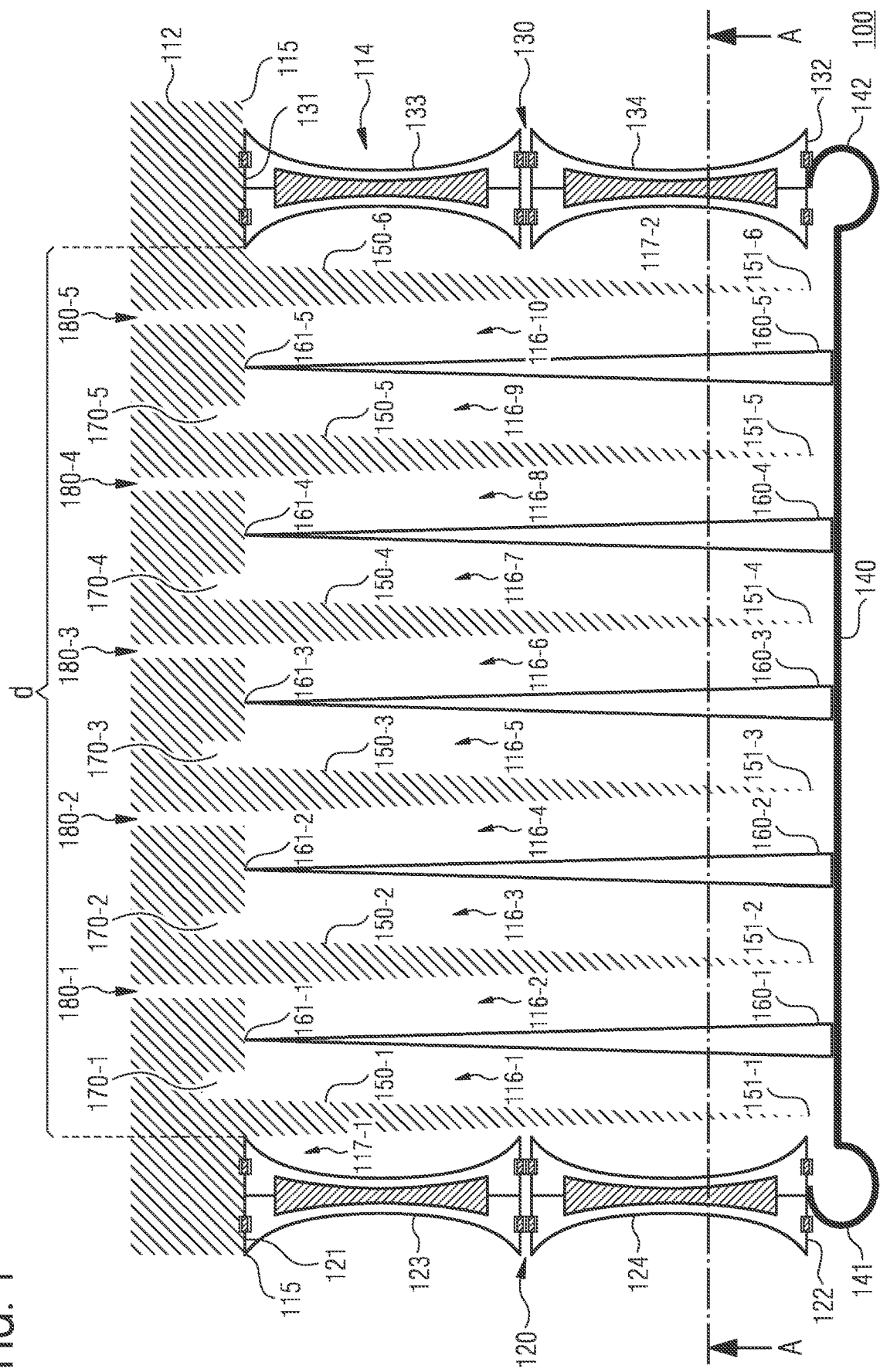

FIG. 1 illustrates a top view of a first MEMS device 100. In particular, FIG. 1 illustrates a top view of a second layer 112 of a layer stack 110 from which the MEMS device 100 is constructed. The structure of the layer stack 110 can be seen in FIG. 2, which illustrates a sectional view of the MEMS device 100 along the sectional line A-A indicated in FIG. 1.

Figure 2:
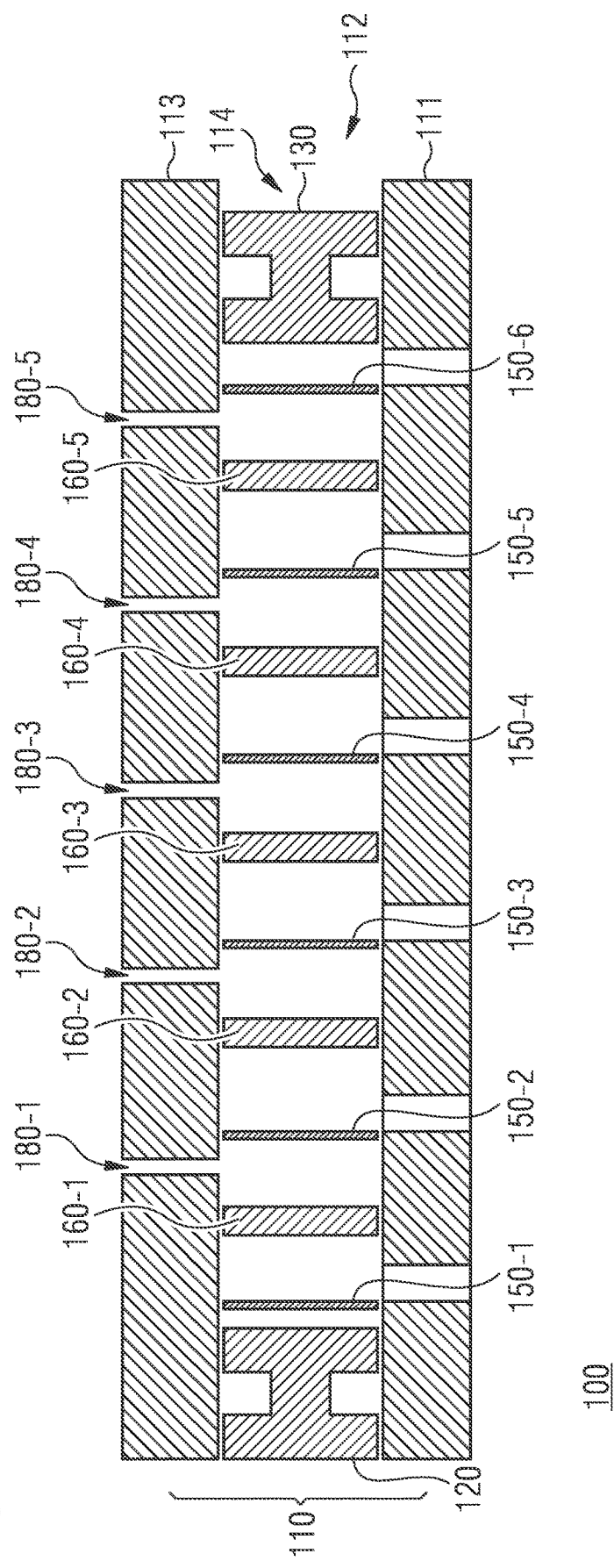
FIG. 2 illustrates a section through the first embodiment of the MEMS device.

It can be seen from FIG. 2 that the stack of layers 110 includes at least a first layer 111, the second layer 112, and a third layer 113. The second layer 112 is formed between the first layer 111 and the third layer 113. A cavity 114 is formed in the second layer 112 in which the other elements of the MEMS device 100 are disposed. The second layer 112 can therefore also be understood as a substrate layer.

The first layer 111 serves as the bottom layer for the second layer 112. The third layer 113 serves as a cover layer for the second layer 112. The first layer 111 and the third layer 113 bound the cavity 114 along the thickness direction of the layer stack 110.

The layers 111 to 113 may comprise electrically conductive materials such as doped semiconductor materials (e.g., doped silicon) or metal materials. The layer-by-layer arrangement of electrically conductive layers enables simple design or structuring, since active elements (e.g., electrodes) as well as passive elements can be formed by selectively dissolving out material from the respective layer. Similarly, layers 111 to 113 may comprise electrically non-conductive materials. The electrically non-conductive materials can be introduced into one of the layers 111 to 113 by means of a deposition process, for example.

For example, the first layer 111, the second layer 112, and the third layer 113 may each be a wafer. The individual wafers are each bonded together in pairs via interlocking processes (e.g., bonding) to form the layer stack 110 with the sequence of layers described above. Accordingly, the cavity 114 may be formed as an acoustically sealed interstitial space in the MEMS device 100.

Two laterally deflectable elements 120 and 130 are laterally spaced apart in the cavity 114. The term "laterally deflectable" should be understood to mean that the two elements 120 and 130 are capable of movement in the plane of the second layer 112, i.e., in-plane movement. In other words: The two laterally deflectable elements 120 and 130 can move within the plane of the second layer 112, but cannot move vertically with respect to the plane of the second layer 112 (i.e., out of the plane of the second layer 112). A lateral distance d between the laterally deflectable elements 120 and 130 can be, for example, at least 2 μm and at most 4 mm. According to embodiment examples, the distance d may be 320 μm or 500 μm, for example.

Each of the two laterally deflectable members 120 and 130 has an end 121 and 131, respectively, connected to a sidewall 115 of the cavity 114. In the case of the model illustrated in FIGS. 1 and 2 illustrated, each of the two laterally deflectable elements 120 and 130 further includes a free end (or a freely movable end) 122 and 132, respectively.

The laterally deflectable elements 120 and 130 can be of various designs or structures. Regardless of the specific structure of the laterally deflectable elements 120 and 130, they are configured to laterally deform when a first potential (e.g., a first voltage signal) is applied and/or to output a second potential (e.g., a second voltage signal) when laterally deformed due to an external force application, respectively. In other words: The laterally deflectable elements 120 and 130 are configured to provide a force converted to motion (i.e., act as an actuator) and/or to sense deformation (i.e., act as a sensor) in response to actuation due to attachment to the sidewall of the cavity 114. For example, the laterally deflectable elements 120 and 130 may be electromechanical transducers, piezoelectric transducers, magnetostrictive transducers, thermomechanical transducers, or a combination thereof to convert the respective energy form or potential into mechanical energy and vice versa. Accordingly, each of the two laterally deflectable elements 120 and 130 may be, for example, electrostatic, piezoelectric, magnetostrictive, and/or thermomechanical electrodes. Based on a respective applied potential, a corresponding deformation of the laterally deflectable elements 120 and 130 in the plane of the second layer 112 can thus be provided or, in the case of lateral deformation due to an external force applied by each of the laterally deflectable elements 120 and 130, a corresponding potential can be provided.

The figures illustrated in FIGS. 1 and 2, laterally deflectable elements 120 and 130 are formed as electrostatic electrodes and have opposing first and second deflectable and laterally deformable sub-elements 123 and 124 and 133 and 134, respectively, that are spaced apart and electrically connected to each other. The laterally deformable sub-elements 123 and 124 or 133 and 134 each have a concavely curved shape. In the simplest case, each of the laterally deformable sub-elements 123 and 124 or 133 and 134 has a three-layer structure with two geometrically different electrode layers which are connected to each other via a non-conductive layer which may be interrupted. When a potential is applied between the at least two electrode layers, an electric field is applied, as a result of which the electrode layers deform laterally (e.g., by changing their length). Due to the mechanical fixation of the laterally deflectable elements 120 and 130 to the side wall of the cavity 114, the degrees of freedom of the resulting deformation are limited, so that a deformation (curvature or deflection) occurs in the plane of the second layer 112. The use of two laterally deformable subelements 123 and 124 or 133 and 134 for each of the laterally deflectable elements 120 and 130 enables a high and adjustable linearity of the laterally deflectable elements 120 and 130.

Deflectable elements, and in particular laterally deflectable elements comprising at least a first electrode layer and a second electrode layer between which a non-conductive layer is formed, are also known as nanoscopic electrostatic drives (NEDs). Examples of embodiments of NEDs are described in patent applications WO 2012/095185 A1, WO 2016/202790 A2 and DE 10 215/206 774 A1 of the Fraunhofer-Gesellschaft zur Förderung der angewandten Wissenschaften, the contents of which are hereby incorporated herein. Lateral NEDs (L-NEDs) deform laterally upon application of a first voltage signal to the first electrode layer and the second electrode layer. Furthermore, L-NEDs generate a second voltage signal at the first electrode layer and the second electrode layer when deformed laterally due to an external force application. Thus, according to some embodiments, the laterally deflectable elements 120 and 130 may be NEDs.

As will be apparent from the further embodiments, the shape of the laterally deflectable elements 120 and 130 is not limited to the concave curved shape illustrated in FIG. 1. In principle, the shape of the laterally deflectable elements 120 and 130 can be arbitrary (e.g., beam-like, roof-like, etc.).

A connecting member 140 is connected to the two laterally deflectable members 120 and 130 to couple the movement of the two laterally deflectable members 120 and 130. In the MEMS device 100 illustrated in FIG. 1, the connecting element 140 is connected to the free ends 122 and 132 of the two laterally deflectable elements 120 and 130. The connecting element 140 is connected to each of the two laterally deflectable elements 120 and 130 via a flexible element 141 or 142. The flexible element 141 or 142 has a lower stiffness than the connecting element 140 and the two laterally deflectable elements 120 and 130. In this way, the laterally deflectable elements 120 and 130 are not rigidly connected to the connecting element 140, so that the tensile forces that occur when the laterally deflectable elements 120 and 130 are deformed can be minimized. The flexible elements 141 and 142, respectively, can be considered as spring elements since they have a lower stiffness than the connecting element 140 and the two laterally deflectable elements 120 and 130. According to some embodiments, the flexible elements 141 and 142 may be omitted.

A plurality of first fingers 150-1, ..., 150-6 are discretely spaced between the two laterally deflectable members 120 and 130 on the side wall 115 of the cavity 114. Further, a plurality of second fingers 160-1, ..., 160-5 are discretely spaced apart from each other between the two laterally deflectable members 120 and 130 on the connecting member 140. It should be noted that the numbers of the first fingers and the second fingers in FIG. 1 are chosen purely arbitrarily to explain the function of the MEMS device 100. In principle, any plurality of first fingers and the second fingers can be selected. For example, the number of first fingers can be between 1 and 50, especially 10 or 20. The number of second fingers may be, for example, between 2 and 51, in particular 11 or 21.

The respective lateral distance between the plurality of first fingers 150-1, ..., 150-6 as well as the respective lateral distance between the plurality of second fingers 160-1, ..., 160-5 is for example between 0 and 100 μm (i.e., 100 μm or less), in particular 10 μm or 15 μm.

An extension (i.e., height) of the plurality of first fingers 150-1, ..., 150-6, the plurality of second fingers 160-1, ..., 160-5 as well as the two laterally deflectable elements 120 and 130 may be between 10 μm and 750 μm along the thickness direction of the second layer 112 (or the layer stack 110), respectively, according to embodiment examples.

A ratio of the extension of the plurality of first fingers 150-1, ..., 150-6 and/or the extension of the plurality of second fingers 160-1, ..., 160-5 along the thickness direction of the second layer 112 to the extension of the two laterally deflectable elements 120 and 130 along the thickness direction of the second layer is between 10% and 100% according to embodiment examples. In other words: The ratio of the height of the laterally deflectable elements 120 and 130 to the height of one of the plurality of first fingers 150-1, ..., 150-6 and to the height of one of the plurality of second fingers 160-1, ..., 160-5, respectively, is between 10% and 100%.

The plurality of second fingers 160-1, ..., 160-5 interlock with the plurality of first fingers 150-1, ..., 150-6. The plurality of second fingers 160-1, ..., 160-5 and the plurality of first fingers 150-1, ..., 150-6 overlap along their longitudinal extent by at least 65%, 85% or 95%. Further, plurality of second fingers 160-1, ..., 160-5 and plurality of first fingers 150-1, ..., 150-6 overlap along the thickness direction of second layer 112 (or layer stack 110) by at least 80%, 90% or 99%.

The plurality of second fingers 160-1, ..., 160-5 and the plurality of first fingers 150-1, ..., 150-6 thus form sub-cavities 116-1, ..., 116-10 within the cavity 114. Laterally, the sub-cavities 116-1, ..., 116-10 are bounded by the side wall 115 of the cavity 114, the connecting member 115, and each by one of the plurality of first fingers 150-1, ..., 150-6 and one of the plurality of second fingers 160-1, ..., 160-5. In the vertical direction, i.e., along the thickness direction of the layer stack 110, the sub-cavities 116-1, ..., 116-10 are bounded by the first layer 111 (as the bottom layer) and the third layer 113 (as the top layer).

The plurality of second fingers 160-1, ..., 160-5 are laterally displaceable relative to the plurality of first fingers 150-1, ..., 150-6 upon (under) deformation of the two laterally deflectable elements 120 and 130 (i.e., along a spatial direction perpendicular to the longitudinal extent of the plurality of second fingers 160-1, ..., 160-5). The lateral distance between a second finger of the plurality of second fingers 160-1, ..., 160-5 and an adjacent first finger of the plurality of first fingers 150-1, ..., 150-6 is thus variable so that the volumes of the sub-cavities 116-1, ..., 116-10 can be changed via the lateral movement of the plurality of second fingers 160-1, ..., 160-5. The plurality of first fingers 150-1, ..., 150-6 and the plurality of second fingers 160-1, ..., 160-5 thus define a plurality of volume variable sub-cavities 116-1, ..., 116-10 within the cavity 114.

Each of the plurality of sub-cavities 116-1, ..., 116-10 is in contact with an ambient fluid (e.g., a gas or liquid) surrounding the MEMS device 100 via a respective opening 170-1, ..., 170-5 or 180-1, ..., 180-5. In the case of adjacent sub-cavities of the plurality of sub-cavities 116-1, ..., 116-10, the opening of one sub-cavity of the adjacent sub-cavities is formed in a different layer of the layer stack 110 than the opening of the other sub-cavity of the adjacent sub-cavities. In the MEMS device illustrated in FIG. 1, the opening 170-1 of the sub-cavity 116-1 is formed in the first layer 111 or the third layer 113 (to which the sub-cavity 116-1 is coupled/connected via the recess/protrusion in the side wall 115). The opening 180-1 of the adjacent sub-cavity 116-2 is formed in the second layer 112. The opening 170-2 of the sub-cavity 116-3 adjacent to the sub-cavity 116-2 is again formed in the first layer 111 or the third layer 113 (to which the sub-cavity 116-3 is coupled/connected via the recess/protrusion in the side wall 115). For the sectional view of FIG. 2, it was assumed that the opening 170-1, ..., 170-5 are formed in the third layer 113. As described above, the opening 170-1, ..., 170-5 may alternatively be formed in the first layer 111.

Two further sub-cavities 117-1 and 117-2 are formed between the first and last, respectively, of the plurality of first fingers 150-1, ..., 150-6 and a respective one of the two laterally deformable members 120 and 130. Due to their design, the other sub-cavities 117-1 and 117-2 have different edges than the sub-cavities 116-1, ..., 116-10. Also, sub-cavities 117-1 and 117-2 are accessible through corresponding openings (not illustrated in FIGS. 1 and 2) connected to the environment of the MEMS device 100. In contrast to the sub-cavities 116-1, ..., 116-10, the sub-cavities 117-1 and 117-2 are not each bounded by a first finger and a second finger, but each bounded by one of the first fingers 150-1 and 150-6 and one of the laterally deformable members 120 and 130.

The laterally deflectable elements 120 and 130, formed in the second layer 112 and spaced apart from each other, are each connected at one end (or side) to the substrate of the second layer 112. The connecting member 140 together with the plurality of second fingers 160-1, ..., 160-5 formed thereon form a comb-like member that interdigitates with the plurality of first fingers 150-1, ..., 150-6 forming the counter fingers. The connecting member 140 can therefore be understood as a kind of comb back on which comb fingers are formed in the form of the plurality of second fingers 160-1, ..., 160-5. The connecting element 140 forming the comb back, the resilient elements 141 and 142 as well as the plurality of second fingers 160-1, ..., 160-5 forming the comb fingers are passive elements which follow the movements of the laterally deflectable elements 120 and 130. The plurality of first fingers 150-1, ..., 150-6 forming the mating fingers are fixed to the substrate of the second layer 112 and have free ends 151-1, ..., 151-6 (which are not coupled or constrained).

The free ends 151-1, ..., 151-6 of the plurality of first fingers 150-1, ..., 150-6 are spaced from the comb back or the connecting element 140 in such a way that a movement of the comb back or of the connecting element 140 and at the same time the distance of each of the plurality of first fingers 150-1, ..., 150-6 to the connecting element 140 is so small that a (significant) volume flow of the ambient fluid through the free space formed between the connecting element 140 and the respective finger of the plurality of first fingers 150-1, ..., 150-6 is not possible. In other words: A (small) gap is formed between each of the plurality of first fingers 150-1, ..., 150-6 and the connecting element 140, the dimensions of which are so small that no (significant) volume flow from or into an adjacent sub-cavity is possible through the gap.

The free ends 161-1, ..., 161-5 of the plurality of second fingers 160-1, ..., 160-5 are correspondingly formed with respect to the side wall 115 of the cavity 114 or the substrate of the second layer 112. The distance between each of the free ends 161-1, ..., 161-5 of the plurality of second fingers 160-1, ..., 160-5 and the side wall 115 of the cavity 114 or the surrounding substrate of the second layer 112 is such that movement of the plurality of second fingers 160-1, ..., 160-5 is not impeded and volume flow of the ambient fluid between the respective finger of the plurality of second fingers 160-1, ..., 160-5 and the side wall 115 of the cavity 114 or the surrounding substrate of the second layer 112 is not possible.

The above-described design or positioning of the free ends of the first and second fingers can prevent an acoustic short circuit between adjacent sub-cavities.

Due to the arrangement of the plurality of first fingers 150-1, ..., 150-6 and the plurality of second fingers 160-1, ..., 160-5 illustrated in FIG. 1, the sub-cavities 116-1, ..., 116-10 serving for interaction with the ambient fluid are formed in the cavity 114. The sub-cavities are each separated or delimited by a first finger, a second finger, the connecting element, and the side wall of the cavity (or the surrounding substrate second layer 112). As described above, due to the movement of the plurality of second fingers 160-1, ..., 160-5 relative to the plurality of first fingers 150-1, ..., 150-6, a volume change of the respective sub-cavity 116-1, ..., 116-10 occurs. The plurality of second fingers 160-1, ..., 160-5 perform the same lateral movement in the plane of the second layer 112 as the laterally deflectable elements 120 and 130 due to their connection to the laterally deflectable elements 120 and 130 by means of the connecting element 140. Via the openings 170-1, ..., 170-5 and 180-1, ..., 180-5, respectively, which connect or couple the individual sub-cavities 116-1, ..., 116-10, respectively, with the environment of the MEMS component 100, a pressure equalization can take place in the individual sub-cavities 116-1, ..., 116-10.

The openings in adjacent sub-cavities are arranged differently or in opposite directions. For example, the openings may also be arranged alternately in either the first layer 111 (e.g., in the form of a handling wafer) or the third layer 113 (e.g., in the form of a lid wafer). For example, if the opening of a first of the sub-cavities 116-1, ..., 116-10 is in the bottom substrate of the handling wafer, the opening of the adjacent sub-cavity is in the lid wafer of the MEMS device 100. Alternatively, as illustrated in FIG. 1, one of the aperture types may be formed in the substrate of the second layer 112 and may be connected to the environment of the MEMS device 100 via the second layer 112. Openings in the second layer 112 may allow for a particularly space-efficient implementation. The formation of the openings of adjacent sub-cavities in different or opposite layers prevents an acoustic short circuit between the adjacent sub-cavities.

As explained above, the two laterally deflectable elements 120 and 130 are configured to deform laterally upon application of, e.g., of a first voltage signal, for example, so that the plurality of second fingers 160-1, ..., 160-5 are displaced in a lateral direction relative to the plurality of first fingers 150-1, ..., 150-6 in order to alternately reduce and increase a volume of one sub-cavity of the adjacent sub-cavities and, conversely, alternately increase and reduce a volume of the other sub-cavity of the adjacent sub-cavities in order to influence the ambient fluid. For example, the lateral displacement of the second finger 160-1 caused by the laterally deflectable elements 120 and 130 alternately decreases and increases the volume of the sub-cavity 116-1 and, conversely, alternately increases and decreases the volume of the adjacent sub-cavity 116-2. Via the openings 170-1, ..., 170-5 and 180-1, ..., 180-5, respectively, the change in volumes of the sub-cavities 116-1, ..., 116-10 act on the ambient fluid present in the environment of the MEMS device 100, thereby affecting it. Accordingly, the MEMS device 100 acts as an actuator.

Conversely, the plurality of second fingers 160-1, ..., 160-5 can also move laterally with respect to the plurality of first fingers 150-1, ..., 150-6 to adjust volumes of the adjacent sub-cavities depending on the ambient fluid while laterally deforming the two laterally deflectable elements. For example, depending on pressure conditions or pressure gradients in the ambient fluid, the volume of the sub-cavity 116-1 can be reduced and the volume of the adjacent sub-cavity 116-2 can be increased, so that the plurality of second fingers 160-1, ..., 160-5 are displaced and, due to the external force effect caused by the displacement of the plurality of second fingers 160-1, ..., 160-5, the two laterally deflectable elements 120 and 130 are laterally deformed and accordingly output, for example, a second voltage signal. In this case, the second voltage signal represents the pressure conditions or pressure gradients in the ambient fluid, so that the MEMS device 100 acts as a sensor.

The sub-cavities 116-1, ..., 116-10 formed between the plurality of first fingers 150-1, ..., 150-6 and the plurality of second fingers 160-1, ..., 160-5 collectively form a large area for interaction with the ambient fluid. In this context, the MEMS device can be used both to influence the ambient fluid, i.e., as an actuator, and to measure the ambient fluid, i.e., as a sensor. Compared to the laterally deflectable elements 120 and 130, the plurality of first fingers 150-1, ..., 150-6 and the plurality of second fingers 160-1, ..., 160-5 exhibit high stiffness with low geometric excitations, such that the first and second fingers themselves are substantially not excited to vibrate and thus do not interfere with or affect interaction with the ambient fluid. The available surface area of the MEMS device 100 can be utilized to a high degree for interaction with the ambient fluid due to the large number of sub-cavities. In particular, when thin first and second fingers are used, more and more closely spaced sub-cavities can be arranged. For example, if the MEMS device 100 is used to output a sound signal (sound field) into the ambient fluid, a higher sound pressure can be achieved. For example, if the MEMS device 100 is used to sense a sound signal in the ambient fluid, a higher sensitivity can be achieved.

In addition, the comb-like arrangements of the first and second fingers allow only a comparatively small (unwanted) electrical capacitance loading to occur. Likewise, the comb-like arrangements of the first and second fingers provide additional adjustment options for fluidic (damping).

As already indicated several times in the description of the individual elements of MEMS device 100, the individual elements of a MEMS device according to the proposed architecture can be modified in many ways compared to the MEMS device 100 illustrated in FIG. 1. Therefore, some other MEMS devices according to the proposed architecture are described in more detail below, essentially highlighting the differences from the MEMS device 100 described in detail above.

FIG. 3 shows a MEMS device 300 with laterally deflectable elements 120 and 130 formed differently compared to MEMS device 100. While the laterally deflectable elements 120 and 130 of the MEMS device 100 are each formed of two sub-elements having a concave curved shape, the laterally deflectable elements 120 and 130 of the MEMS device 300 are beam-like and beam-shaped, respectively.

On both lateral sides of the laterally deflectable elements 120 and 130, they each have a first electrode layer 125 and 135, respectively, and a second electrode layer 126 and 136, respectively, between which an interrupted, non-conductive layer 127 and 137, respectively, is formed. The linearity of the laterally deflectable elements 120 and 130 of the MEMS device 300 is also very high and adjustable.

By applying a first voltage signal to the first electrode layer 125 and 135, respectively, and the second electrode layer 126 and 136, respectively, the deflectable elements 120 and 130 can be laterally deformed, respectively, to operate the laterally deflectable elements 120 and 130 as actuators to affect the ambient fluid.

Conversely, when the deflectable elements 120 and 130 are laterally deformed due to an external force applied by the ambient fluid, a second voltage signal is generated at the first electrode layer and the second electrode layer, so that the laterally deflectable elements 120 and 130 serve as sensors for sensing the ambient fluid.

The plurality of first fingers 150-1, . . . , 150-6 as well as the plurality of second fingers 160-1, . . . , 160-5 are running in the case of the fingers illustrated in FIGS. 1 to 3 illustrated in the embodiment examples. A cross-section of each of the plurality of first fingers 150-1, . . . , 150-6 thus decreases from an end of the respective first finger connected to the side wall 115 of the cavity 144 toward the free end 151-1, . . . , 151-6 of the respective first finger. Accordingly, a cross-section of each of the plurality of second fingers 160-1, . . . , 160-5 decreases from an end of the respective second finger connected to the connecting member 140 to a free end 161-1, . . . , 161-5 of the respective second finger.

Figure 4:
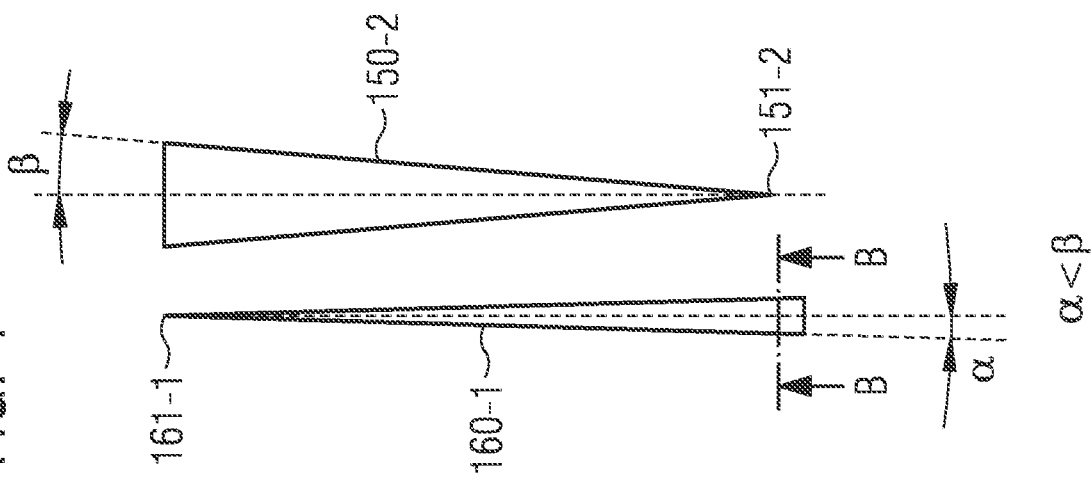

In FIG. 4, the first finger 150-2 and the second finger 160-1, which are adjacent to each other, are illustrated enlarged again. The geometric relationships of the plurality of first fingers 150-1, . . . , 150-6 and the plurality of second fingers 160-1, . . . , 160-5 are again illustrated by the fingers 150-2 and 160-1 illustrated as examples in FIG. 4.

Both the first finger 150-2 and the second finger 160-1 each have a basic wedge shape along their longitudinal extent, i.e., a tapering cross-section. The second finger 160-1 has a flank angle α (angle between the center line and the side flank of the second finger 150-2), while the first finger 150-2 has a flank angle β. The respective flank angle indicates the ratio of the lateral extension (i.e., the extension along the side wall 115 of the cavity 114) to the longitudinal extension (i.e., from the side wall 115 of the cavity 114 to the connecting element 140 and vice versa) of the respective finger. For example, the flank angle α can be between 0 and 30°, in particular 10° or 3°. The flank angle β can be, for example, between 0 and 30°, in particular 10° or 3°. The flank angle β of the first finger 150-2 is always larger than the flank angle α of the second finger 160-1. In other words: A ratio of a lateral extent of a finger of the plurality of first fingers 150-1, . . . , 150-6 to its longitudinal extent is larger than a ratio of a lateral extent of a finger of the plurality of second fingers 160-1, . . . , 160-5 to its longitudinal extent.

Due to the larger flank angle β, the end of the first finger 150-2 attached to the substrate is relatively wider than the end of the second finger 160-1 correspondingly attached to the connecting element 140. Further, the first finger 150-2 is relatively wider than the second finger 160-1 due to the larger flank angle β3.

The plurality of first fingers 150-1, . . . , 150-6 are thus more massive than the plurality of second fingers 160-1, . . . , 160-5, so that they are more difficult to be excited to vibrate due to the changing volumes of the sub-cavities. Accordingly, the more massive first fingers can provide effective decoupling of the sub-cavities.

The wedge-shaped courses of the fingers along their longitudinal extensions also have the advantage that the plurality of first fingers 150-1, . . . , 150-6 and the plurality of second fingers 160-1, . . . , 160-5 can be arranged a short distance apart. The lateral distance a between the first finger 150-2 and the second finger 160-1 indicated in FIG. 5 can be, for example, between 0 and 100 µm, in particular 15 µm or 10 µm. Moreover, due to the wedge-shaped courses of the fingers, the second finger 160-1 can be deflected further in the lateral direction relative to the first finger 150-2 than is possible, for example, for beam-shaped fingers. Accordingly, the interaction with the ambient fluid may be improved.

Figure 5:
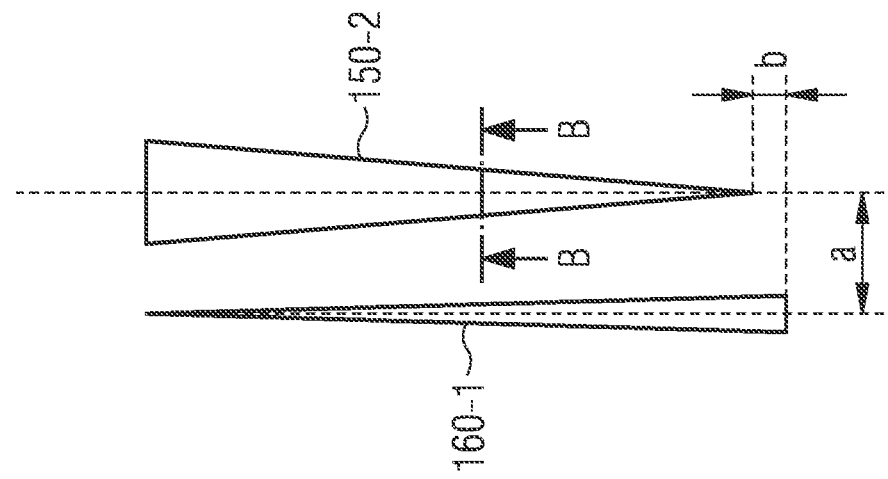

In FIG. 5, it is further indicated by means of the distance b that the free end 151-2 of the first finger 150-2 does not contact the connecting element 140 on which the second finger 160-1 is arranged. Rather, the distance b remains between the free end 151-2 of the first finger 150-2 and the connecting element 140. The same applies to the free end 161-1 of the second finger 160-1 with respect to the side wall 115 of the cavity 114 on which the first finger 150-2 is arranged.

Figure 6:
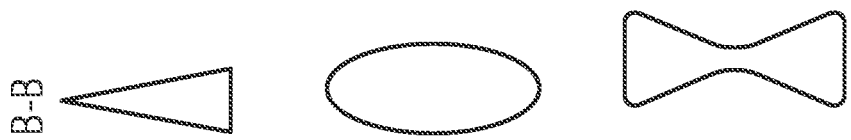
FIGS. 4 to 6 illustrate embodiments of geometric ratios of the first fingers and the second fingers.

As indicated several times above, the cross-section of the plurality of first fingers 150-1, . . . , 150-6 as well as the plurality of second fingers 160-1, . . . , 160-5 may be substantially arbitrary. FIG. 6 illustrates a sectional view along section line B-B in FIG. 5 to indicate different possible cross-sections for the first and second fingers. For example, the fingers may have a wedge-shaped cross-section, an oval cross-section, or a concave cross-section as illustrated in FIG. 6. In some embodiments, the first and/or second fingers may also have a beam-shaped (i.e., rectangular, e.g., square) cross-section. According to embodiments, individual fingers of the plurality of first fingers 150-1, . . . , 150-6 as well as the plurality of second fingers 160-1, . . . , 160-5 may have different cross-sections and/or combinations of the above cross-sectional shapes.

Figure 7:
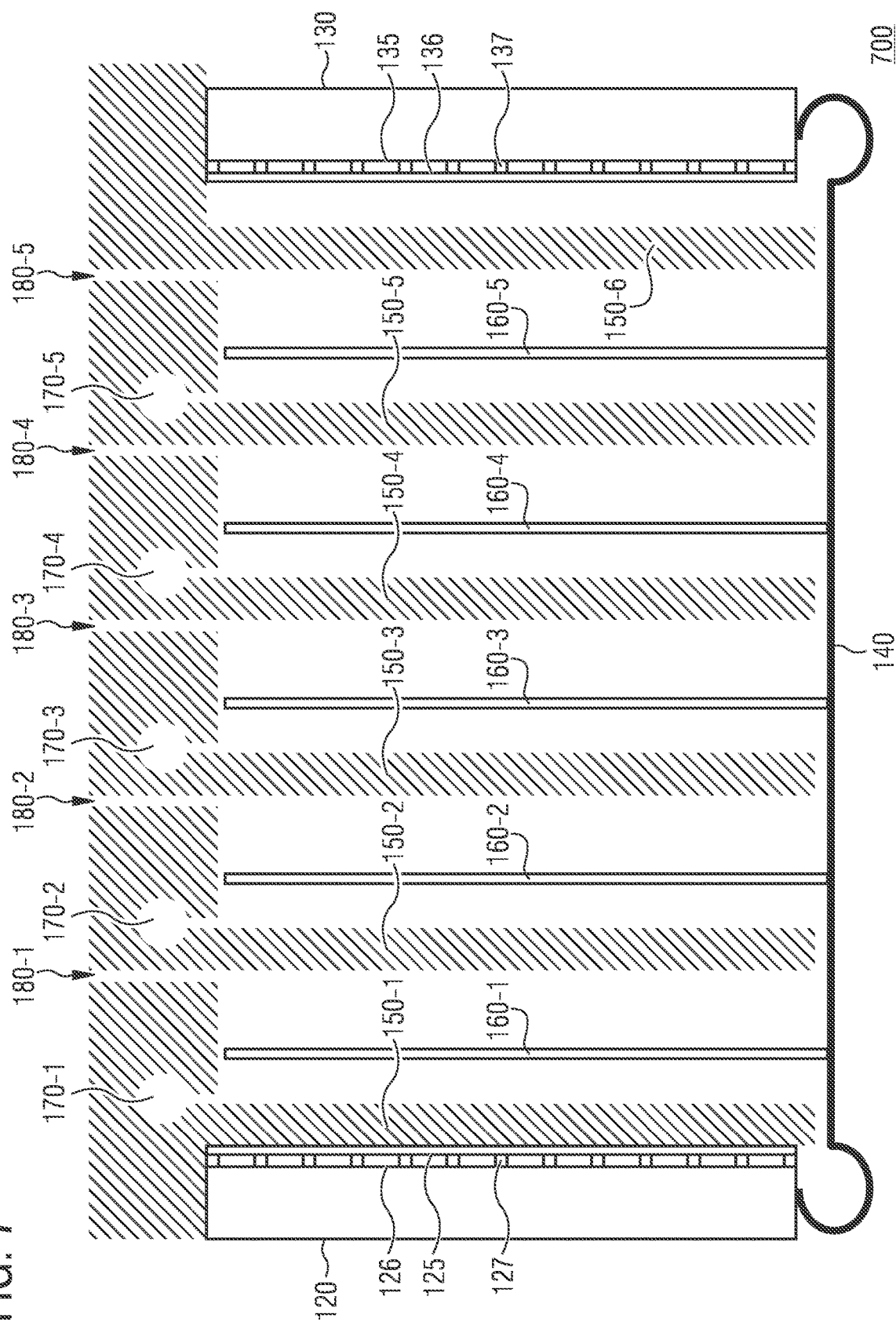
FIG. 7 illustrates a top view of a third embodiment of a MEMS device.

FIG. 7 illustrates another MEMS device 700, with laterally deflectable elements 120 and 130 formed differently compared to MEMS devices 100 and 300. Unlike the laterally deflectable elements 120 and 130 of the MEMS device 300, the laterally deflectable elements 120 and 130 of the MEMS device 700 each have the first electrode layer 125 and 135, respectively, and the second electrode layer 126 and 136, respectively, between which the interrupted non-conductive layer 127 and 137, respectively, are formed, on only one lateral side of the laterally deflectable elements 120 and 130. The cross-sections of the two electrode layers, 125 or 135 and 126 or 136, differ here to allow lateral deformation when a potential is applied.

Further, the plurality of first fingers 150-1, . . . , 150-6 as well as the plurality of second fingers 160-1, . . . , 160-5 are formed differently in MEMS device 700 than in MEMS devices 100 and 300. Unlike the plurality of first fingers 150-1, . . . , 150-6 as well as the plurality of second fingers 160-1, . . . , 160-5 in the MEMS devices 100 and 300, the plurality of first fingers 150-1, . . . , 150-6 as well as the plurality of second fingers 160-1, . . . , 160-5 in the MEMS device 700 do not taper. The cross-section of each of the plurality of first fingers 150-1, . . . , 150-6 and each of the plurality of second fingers 160-1, . . . , 160-5 remains substantially constant from its end connected to the side wall 115 of the cavity 144 and its end connected to the connecting member 140, respectively, toward the free end of the respective finger.

Furthermore, it is indicated in FIG. 7 that the shape of the openings of the individual sub-cavities can also be variable or essentially arbitrary. While the openings 170-1, . . . , 170-5 in FIGS. 1 and 3 are illustrated as substantially rectangular, the openings 170-1, . . . , 170-5 are substantially circular. It should be noted that the dimensions illustrated in FIGS. 1, 3 and 7 illustrated shapes for openings 170-1, ..., 170-5 are chosen purely as examples to illustrate the proposed architecture. The openings 170-1, ..., 170-5 may have any other shape (e.g., oval, n-cornered, free form, etc.). The same applies to openings 180-1, ..., 180-6.

Figure 8:
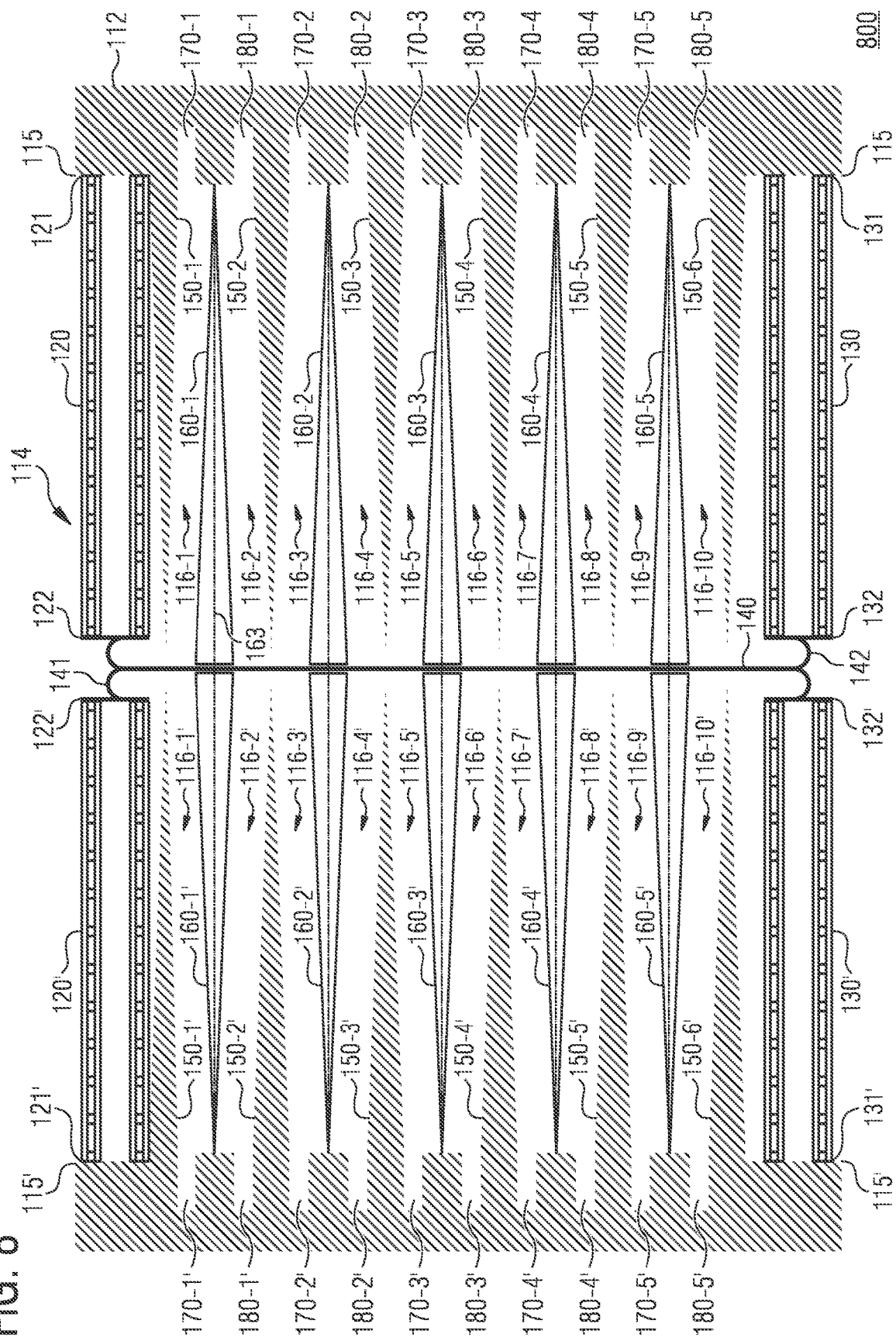
FIG. 8 illustrates a top view of a fourth embodiment of a MEMS device.

FIG. 8 further illustrates a top view of another MEMS device 800 with comb-like structures arranged on both sides of the interconnect element 140. As can be seen from FIG. 8, the MEMS device 300 described above in connection with FIG. 3 is thereby substantially mirrored on the connection element 140 to obtain the second comb-like structure.

MEMS device 800 includes the elements described below in addition to those already described above in connection with MEMS device 300.

The MEMS device 800 further includes two additional laterally deflectable elements 120' and 130' that are laterally spaced apart from each other in the cavity 114. Each of the two further laterally deflectable elements 120' and 130' has an end connected to a further side wall 115' of the cavity 114 on 121' and 131', respectively. The connecting element 140 is connected to the free ends 122' and 132', respectively, of the two further laterally deflectable elements 120' and 130' via correspondingly adapted flexible element 141. The two further laterally deflectable elements 120' and 130' can be designed in the same way as the laterally deflectable elements 120 and 130.

Further, a plurality of third fingers 150-1', ..., 150-6' are discretely spaced between the two further laterally deflectable members 120' and 130' on the further side wall 115' of the cavity 114.

A plurality of fourth fingers 160-1', ..., 160-5' are discretely spaced apart from each other between the two further laterally deflectable members 120' and 130' on the connecting member 140. The plurality of second fingers 160-1, ..., 160-5 and the plurality of fourth fingers 160-1', ..., 160-5' are disposed on opposite sides of the connecting member 140. The plurality of fourth fingers 160-1', ..., 160-5' interlock with the plurality of third fingers 150-1', ..., 150-6' in the same manner as the plurality of second fingers 160-1, ..., 160-5 interlock with the plurality of first fingers 150-1, ..., 150-6. Accordingly, the plurality of third fingers 150-1', ..., 150-6' and the plurality of fourth fingers 160-1', ..., 160-5' define a further plurality of volume variable sub-cavities 116-1', ..., 116-10' within the cavity 114.

Each of the further plurality of sub-cavities 116-1', ..., 116-10' is in contact with the ambient fluid via a respective opening 170-1', ..., 170-5' or 180-1', ..., 180-5', analogously to the sub-cavities 116-1, ..., 116-10. The openings 170-1', ..., 170-5' and 180-1', ..., 180-5' are formed analogously to the openings 170-1, ..., 170-5 and 180-1, ..., 180-5, respectively. Thus, for adjacent sub-cavities of the further plurality of sub-cavities 116-1', ..., 116-10', the opening of one sub-cavity of the adjacent sub-cavities is formed in a different layer of the first layer 111, the second layer 112, and the third layer 113 from the opening of the other sub-cavity of the adjacent sub-cavities, respectively. Openings 170-1', ..., 170-5' or 180-1', ..., 180-5' formed alternately in either the first layer 111 (e.g., in the form of a handling wafer) or the third layer 113 (e.g., in the form of a lid wafer) are connected to the sub-cavities 116-1', ..., 116-10' via a corresponding recess in the side wall 115 or the further side wall 115' of the cavity 114. Due to the top view, the first layer 111 and the third layer 113 are not illustrated in FIG. 8.

Laterally deflectable elements 120, 120', 130, and 130' move in the same direction in MEMS device 800.

Opposite fingers of the plurality of second fingers 160-1, ..., 160-5 and the plurality of fourth fingers 160-1', ..., 160-5' have a common axis of symmetry 163, i.e., they are mirror-inverted with respect to the connecting element 140. Advantageously, this structure can be used to compensate for fluid resistance-induced moments resulting from the movement of the plurality of second fingers 160-1, ..., 160-5 and the plurality of fourth fingers 160-1', ..., 160-5' relative to the ambient fluid. In this way, stresses in the material in the region of the clamping or fastening of the plurality of second fingers 160-1, ..., 160-5 and the plurality of fourth fingers 160-1', ..., 160-5' to the connecting element 140 can be (significantly) reduced. Therefore, very thin fingers (i.e., fingers with small lateral extension) can be used for the plurality of second fingers 160-1, ..., 160-5 and the plurality of fourth fingers 160-1', ..., 160-5'.

With the structure illustrated in FIG. 8, an increased packing density of the active (laterally deflectable elements) and the passive (other elements) elements in the overall structure can be realized.

Figure 9:
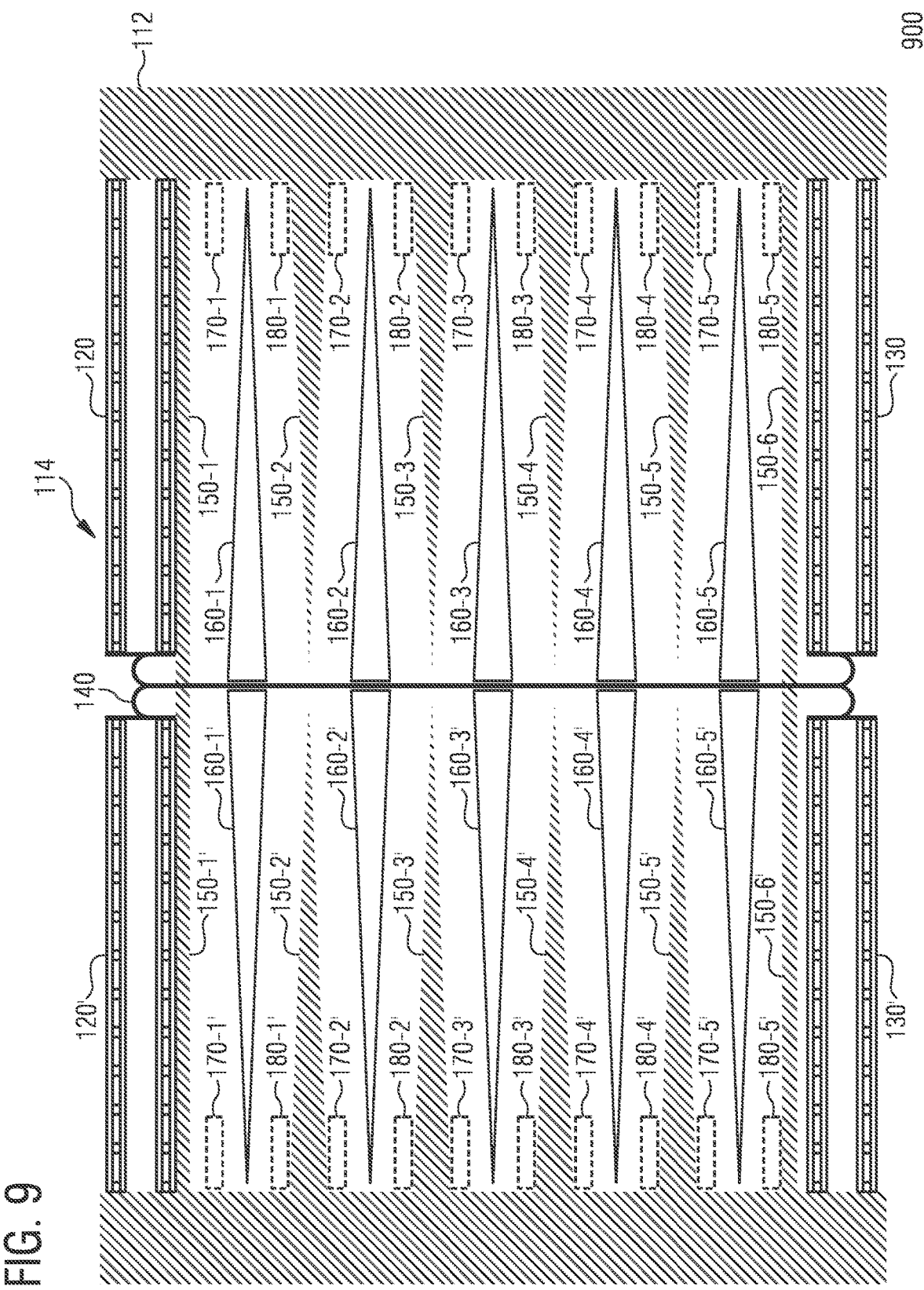
FIG. 9 illustrates a top view of a fifth embodiment of a MEMS device.

FIG. 9 illustrates another MEMS device 900 in which the connection of the openings 170-1, ..., 170-5 and 180-1, ..., 180-5 and 170-1', ..., 170-5' and 180-1', ..., 180-5', respectively, to the sub-cavities 116-1, ..., 116-10 and 116-1', ..., 116-10' is modified compared to MEMS device 800. The openings 170-1, ..., 170-5 and 180-1, ..., 180-5 and 170-1', ..., 170-5' and 180-1', ..., 180-5' are formed exclusively in the first layer 111 and the third layer 113 in MEMS device 900 compared to MEMS device 800. No recesses are required in the side wall 115 or the further side wall 115' of the cavity 114 to connect the openings 170-1, ..., 170-5 and 180-1, ..., 180-5 and 170-1', ..., 170-5' and 180-1', ..., 180-5', respectively, to the sub-cavities 116-1, ..., 116-10 and 116-1', ..., 116-10'. The positions of the openings 170-1, ..., 170-5 and 180-1, ..., 180-5 and 170-1', ..., 170-5' and 180-1', ..., 180-5' in the first layer 111 and the third layer 113, respectively, are illustrated in dashed lines in FIG. 9.

Likewise, MEMS component 900 is modified compared to MEMS component 800 in that the first finger and the last finger of the plurality of first fingers 150-1, ..., 150-6 as well as the plurality of third fingers 150-1', ..., 150-6' (i.e., the first and third fingers immediately adjacent to the laterally deflectable elements 120, 120', 130 and 130') do not have a cross-section tapering towards the free end of the respective finger, but a substantially constant cross-section (i.e., a uniform or constant width). FIG. 9 thus illustrates that different fingers can have different shapes.

Figure 10:
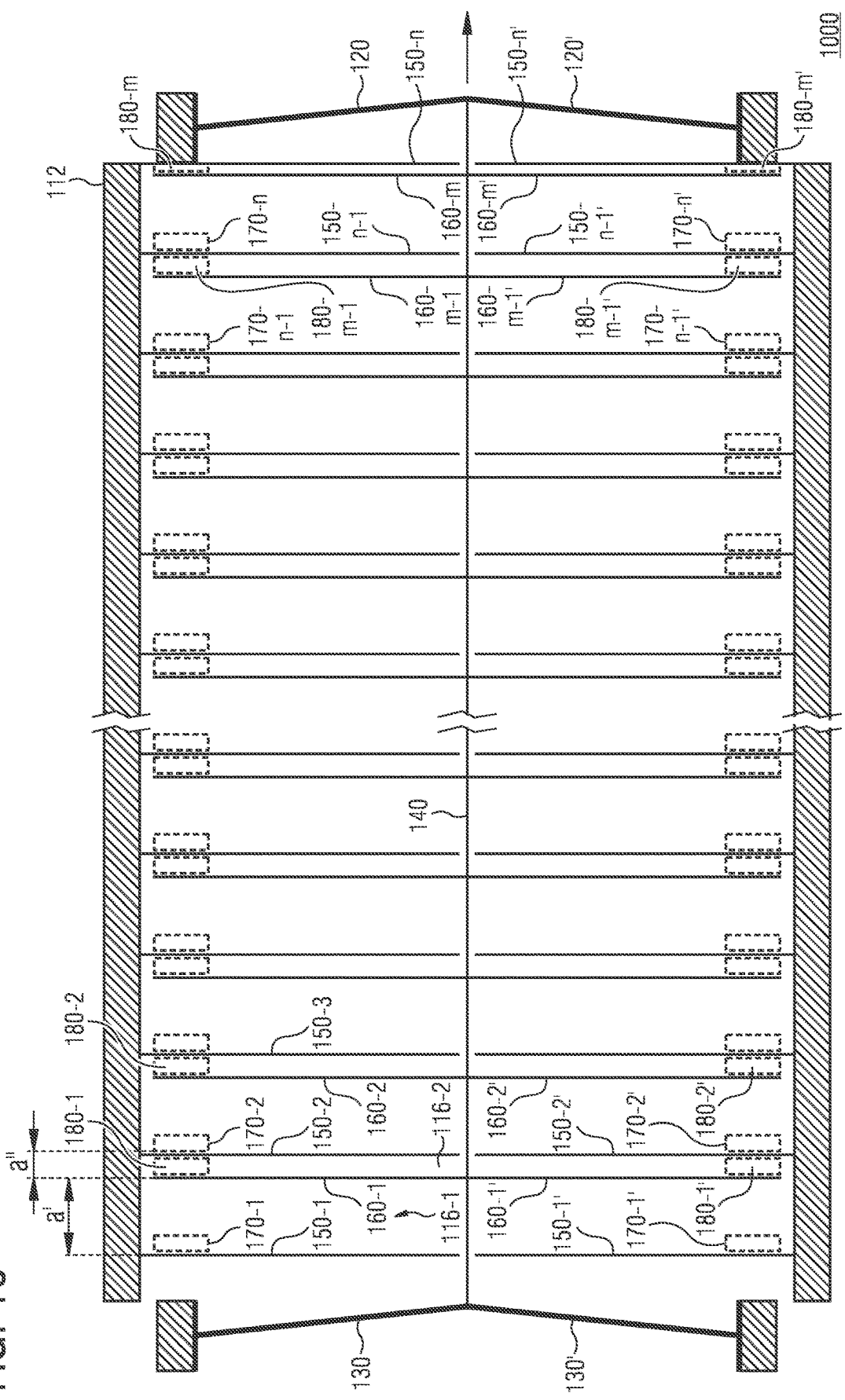
FIGS. 10 and 11 illustrate an embodiment example of a movement of a sixth MEMS device.
Figure 11:
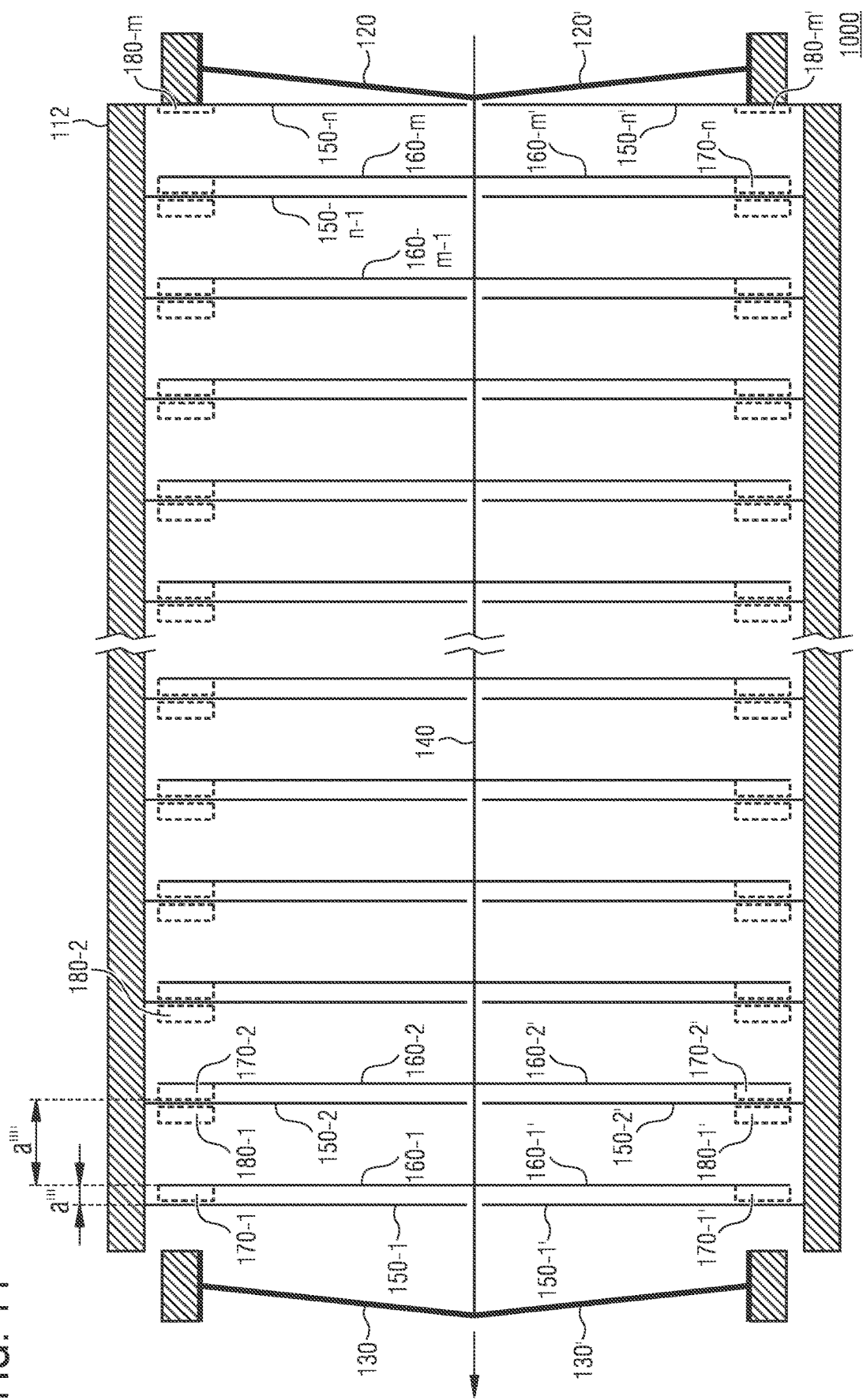

The FIGS. 10 and 11 schematically illustrate another MEMS device 1000 during lateral deflections in opposite directions. As can be seen in FIG. 10, MEMS device 1000, like MEMS devices 800 and 900, has two comb-like structures.

Thus, the second plurality of fingers 160-1, ..., 160-$m$, which interlock with the first plurality of fingers 150-1, ..., 150-$n$, and the fourth plurality of fingers 160-1', ..., 160-$m'$, which interlock with the third plurality of fingers 150-1', ..., 150-$n'$, are arranged on opposite sides of the connecting element 140, which is movable in the lateral direction via the laterally deflectable elements 120, 120', 130 and 130'.

In the situation illustrated in FIG. 10, the laterally deflectable elements are bent to the right, i.e., laterally deformed in a first direction, so that during a first time interval in adjacent sub-cavities, a volume of one sub-cavity of the adjacent sub-cavities is increased and a volume of the other sub-cavity of the adjacent sub-cavities is decreased. This is exemplified in FIG. 10 for sub-cavities 116-1 and 116-2.

Due to the lateral deflection/displacement of the second plurality of fingers 160-1, ..., 160-*m* by the laterally deflectable elements 120, 120', 130 and 130', the lateral distance between the first finger 150-1 and the second finger 160-1 increases from the value a in the undeflected state (see FIG. 5) to the value a', so that the volume of the sub-cavity 116-1 increases. Conversely, the lateral distance between the second finger 160-1 and the first finger 150-2 decreases from the value a in the undeflected state (see FIG. 5) to the value a", so that the volume of the sub-cavity 116-2 decreases. This applies accordingly to the other sub-cavities.

Due to the increase in volume of the sub-cavity 116-1, there is a volumetric flow of ambient fluid through the opening 170-1 (in the lid wafer) into the sub-cavity 116-1. Conversely, due to the reduction in volume of sub-cavity 116-2, a volumetric flow of fluid occurs out of sub-cavity 116-2 through opening 180-1 (in the bottom wafer) to convey the fluid out of sub-cavity 116-2. This applies accordingly to the further sub-cavities, so that fluid flows through the openings 170-1, ..., 170-*n* and 170-1', ..., 170-*n*' into a first portion of all sub-cavities from the environment of the MEMS device 1000 and, conversely, fluid flows through the openings 180-1, ..., 180-*m* and 180-1', ..., 180-*m*' from a second portion of all sub-cavities into the environment of the MEMS device 1000.

In the situation illustrated in FIG. 11, the laterally deflectable elements are now bent to the left, i.e., laterally deformed in a reverse second direction, so that during a second time interval the volume of one sub-cavity of the adjacent sub-cavities is now inversely increased and the volume of the other sub-cavity of the adjacent sub-cavities is decreased. This is again exemplified in FIG. 11 for sub-cavities 116-1 and 116-2.

Due to the lateral deflection/displacement of the second plurality of fingers 160-1, ..., 160-*m* in the opposite direction by the laterally deflectable elements 120, 120', 130 and 130', the lateral distance between the first finger 150-1 and the second finger 160-1 decreases from the value a in the undeflected state (see FIG. 5) to the value a''', so that the volume of the sub-cavity 116-1 decreases. Conversely, the lateral distance between the second finger 160-1 and the first finger 150-2 increases from the value a in the undeflected state (see FIG. 5) to the value a'''', so that the volume of the sub-cavity 116-2 increases. This applies accordingly to the other sub-cavities.

Due to the increase in volume of the sub-cavity 116-2, there is a volumetric flow of the ambient fluid through the opening 180-1 into the sub-cavity 116-2. Conversely, due to the reduction in the volume of the sub-cavity 116-1, a volumetric flow of fluid occurs out of the sub-cavity 116-1 through the opening 170-1 to convey the fluid out of the sub-cavity 116-1. This applies accordingly to the further sub-cavities, so that fluid flows through the openings 180-1, ..., 180-*m* and 180-1', ..., 180-*m*' into the second portion of all sub-cavities from the environment of the MEMS device 1000 and, conversely, fluid flows through the openings 170-1, ..., 170-*n* and 170-1', ..., 170-*n*' from the first portion of all sub-cavities into the environment of the MEMS device 1000.

The fluid flows into/out of the individual sub-cavities during the second time interval illustrated in FIG. 11 are thus the reverse of the fluid flows into/out of the individual sub-cavities during the first time interval illustrated in FIG. 10.

By appropriately driving the laterally deflectable elements 120, 120', 130 and 130' (e.g., via an electrical, magnetic or thermal potential), the induced motion of the second plurality of fingers 160-1, ..., 160-*m* and the fourth plurality of fingers 160-1', ..., 160-*m*' can thus be used to influence the ambient fluid in the vicinity of the MEMS device (e.g., cause it to vibrate).

When the laterally deflectable elements 120, 120', 130, and 130' of the MEMS device 1000 are not actively actuated, but are used as sensors to sense the pressure conditions or pressure gradients of the ambient fluid, the pressure sensors illustrated in FIGS. 10 and 11 can also result from the pressure conditions or pressure gradients of the ambient fluid. For example, a change in pressure in the ambient fluid may cause the pressure illustrated in FIGS. 10 and 11 illustrated cause changes in the volumes of the individual sub-cavities so that lateral deformation of the laterally deflectable elements 120, 120', 130, and 130' occurs in response to the change in pressure in the ambient fluid surrounding the MEMS device 1000. The laterally deflectable elements 120, 120', 130, and 130' then output a corresponding (e.g., electrical, magnetic, or thermal) potential based on their lateral deformation that describes the pressure change in the ambient fluid.

It goes without saying that the above comments on FIGS. 10 and 11 also apply in an analogous manner to the further embodiments of the present disclosure.

Figure 12:
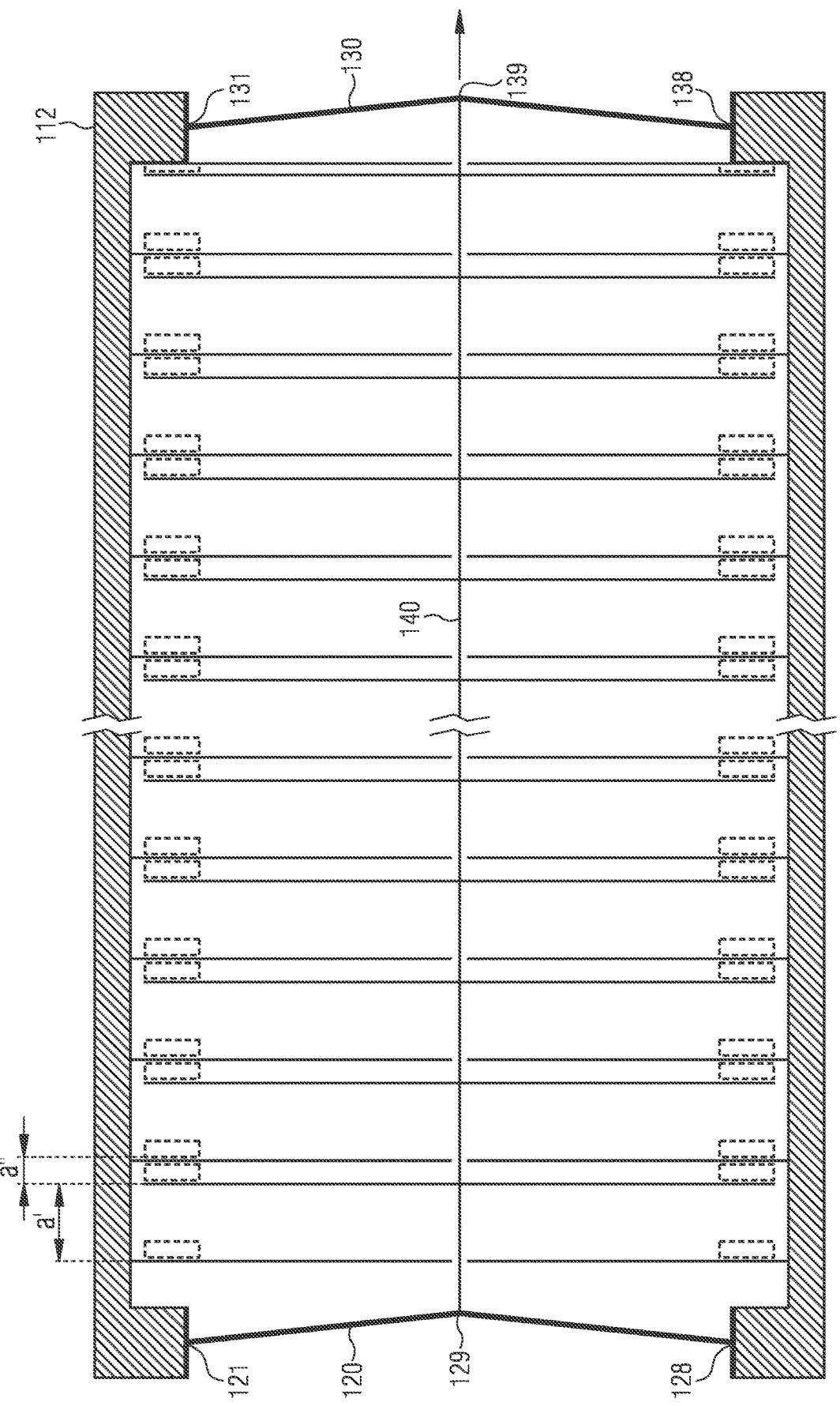
FIG. 12 illustrates a top view of a seventh embodiment of a MEMS device.

In the previously described MEMS devices according to the present architecture, each of the laterally deflectable elements had a respective end attached to the substrate of the second layer (i.e., a clamped end) and a free end to which the interconnect member 140 is attached. However, such clamping of the laterally deflectable elements is only one possible option. FIG. 12 illustrates an alternative MEMS device 1200 in which the laterally deflectable elements are clamped at both ends, i.e., do not have a free or floating end.

MEMS device 1200 is identical to MEMS device 1000 except for the clamping of the laterally deflectable elements, so only this difference will be discussed below.

The MEMS device 1200 includes two laterally deflectable elements 120 and 130 that, as in the preceding embodiments, include an end 121 and 131, respectively, connected to the side wall 115 of the cavity 114. Further, the two laterally deflectable elements 120 and 130 each include a further end 128 and 138, respectively, connected to the further side wall 115' of the cavity 114. The side wall 115 and the further side wall 115' are opposite each other, so that the two laterally deflectable elements 120 and 130 are now clamped at their two ends. Since the ends 121 or 131 and 128 or 138 of the two laterally deflectable elements 120 and 130 are located in the position illustrated in FIG. 12 embodiment example illustrated are not movable, the deformation of the two laterally deflectable elements 120 and 130 takes place in a respective center region 129 and 139 along their longitudinal extent. This is illustrated in FIG. 12 as an example for a lateral deflection to the right, analogous to the situation illustrated in FIG. 10. The connecting element 140 is therefore correspondingly coupled to the respective center region 129 or 139 of the two laterally deflectable elements 120 and 130. Similar to the embodiments regarding MEMS device 1000, the second and fourth fingers can be laterally deflected relative to the first and third fingers, respectively, by the laterally deflectable elements 120 and 130 clamped on both sides.

While the preceding sections have focused on the details of MEMS devices according to the proposed architecture, the following sections will elaborate on the application of MEMS devices.

Figure 13:
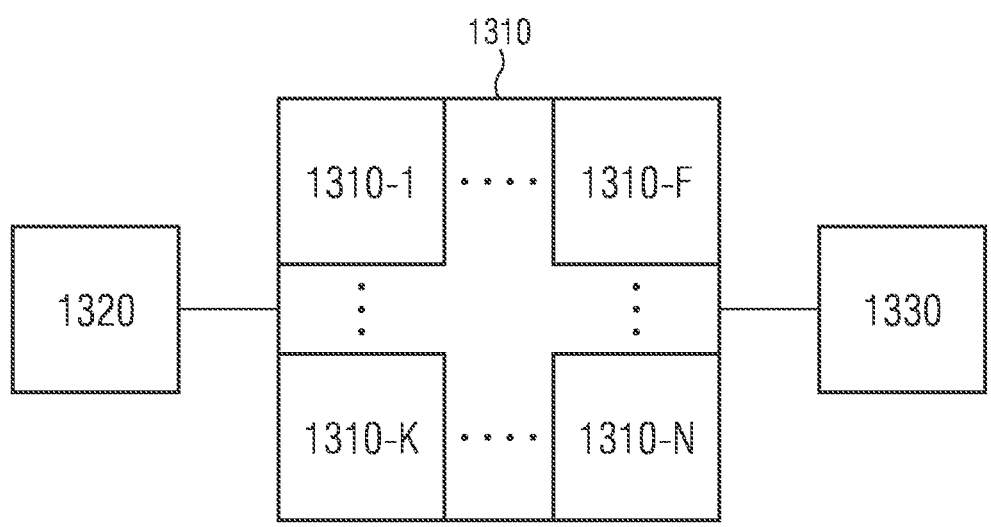
FIG. 13 illustrates an embodiment of an assembly with a plurality of MEMS components.

For this purpose, an assembly 1300 is illustrated in FIG. 13. The assembly 1300 includes a plurality of MEMS devices 1310 according to the proposed architecture or one of the embodiments described herein. The arrangement of the MEMS devices with respect to each other is indicated by the illustration of each MEMS device 1310-1, 1310-F, 1310-K, and 1310-N. The plurality of MEMS devices 1310 may be oriented in substantially any orientation relative to each other. For example, the plurality of MEMS devices 1310 may be formed on a common semiconductor chip or die.

Depending on the type of assembly 1300, the assembly may include a control circuit 1320 and/or a measurement circuit 1330.

The control circuit 1320 is configured to provide at least a first potential (e.g., a first voltage signal, a first magnetic potential, or a first thermal potential) to the laterally deflectable elements of at least a portion of the plurality of MEMS devices 1310 to operate the respective laterally deflectable elements as actuators to affect the ambient fluid.

The measurement circuit 1330 is configured to measure second potentials (e.g., a second voltage signal, a second magnetic potential, or a second thermal potential) of the respective laterally deflectable elements of at least a portion of the plurality of MEMS devices 1310 to operate the respective laterally deflectable elements as sensors for the ambient fluid.

If the plurality of MEMS devices 1310 are to be operated as actuators, the assembly 1300 includes control circuitry 1320. For example, the assembly 1300 may be a headphone, a speaker, or the like, such that the ambient fluid surrounding the MEMS devices 1310 is influenced to output a sound signal via the plurality of MEMS devices 1310. According to further embodiments, the assembly 1300 may also be a fluid pump, such that the plurality of MEMS devices 1310 are used to influence the ambient fluid surrounding the MEMS devices 1310 to transport fluid.

If the plurality of MEMS devices 1310 are to be operated as sensors, the assembly 1300 includes the sensing circuit 1330. For example, the assembly 1300 may be a microphone that provides sensing of the ambient fluid surrounding the MEMS devices 1310 via the plurality of MEMS devices 1310.

According to embodiments, a first portion of the plurality of MEMS devices 1310 may also operate as actuators and a second portion of the plurality of MEMS devices 1310 may operate as sensors. For example, in this embodiment, the assembly 1300 may be active noise cancelling headphones.

As discussed above, the arrangement of the plurality of MEMS devices 1310 relative to each other may be substantially arbitrary. In the following, with reference to FIGS. 14 to 17, some possible arrangements of the MEMS devices within the assembly are presented for illustration. In the FIGS. 14 to 17, four MEMS devices 1310-1, . . . , 1310-4 each are illustrated for better understanding. It is self-evident that the components used in connection with FIGS. 14 to 17 are not limited to assemblies with exactly four MEMS components, but apply to any number of MEMS components.

Figure 14:
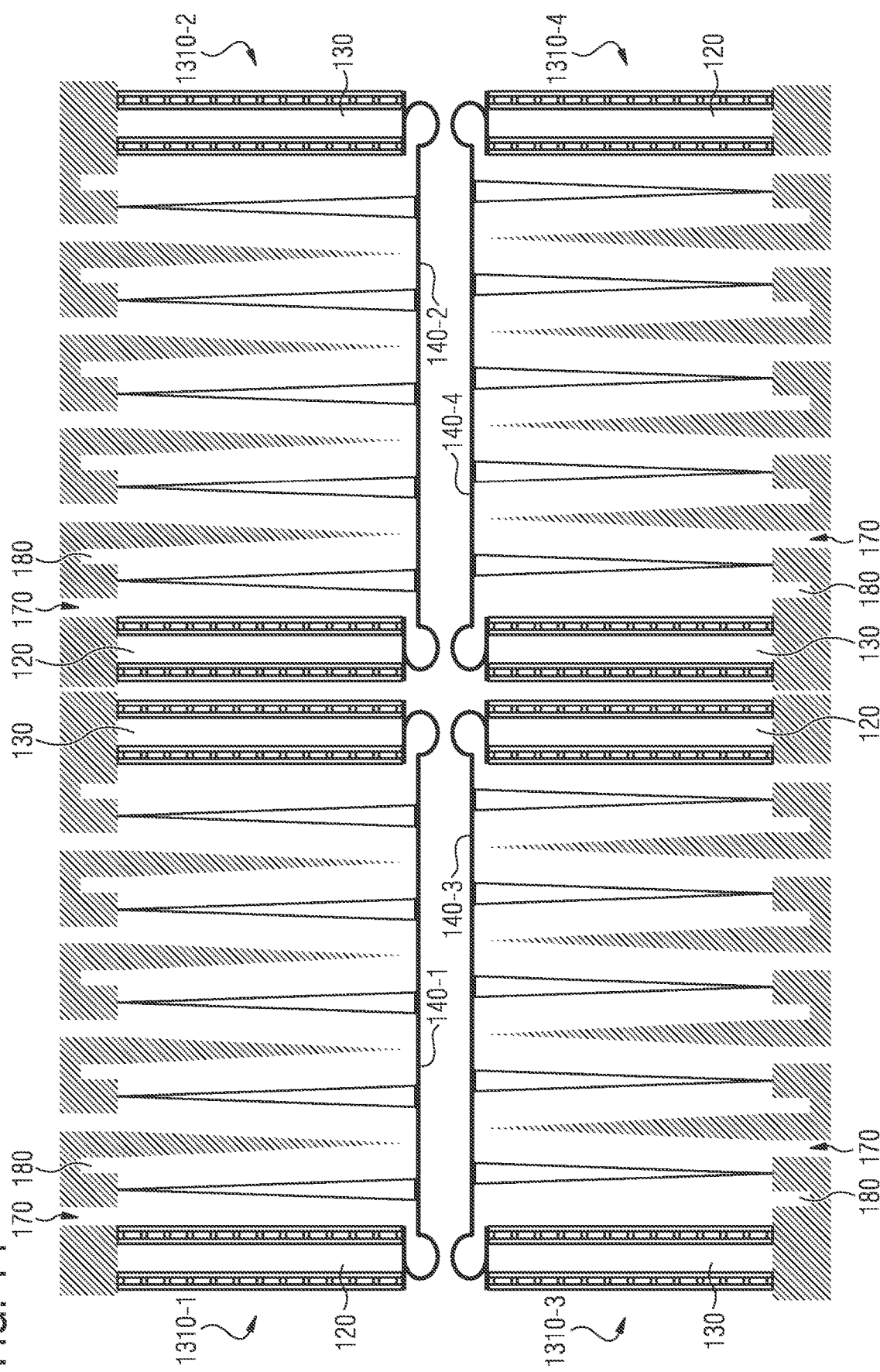
FIGS. 14 to 17 illustrate embodiments for the arrangement of the MEMS components within the assembly.
Figure 15:
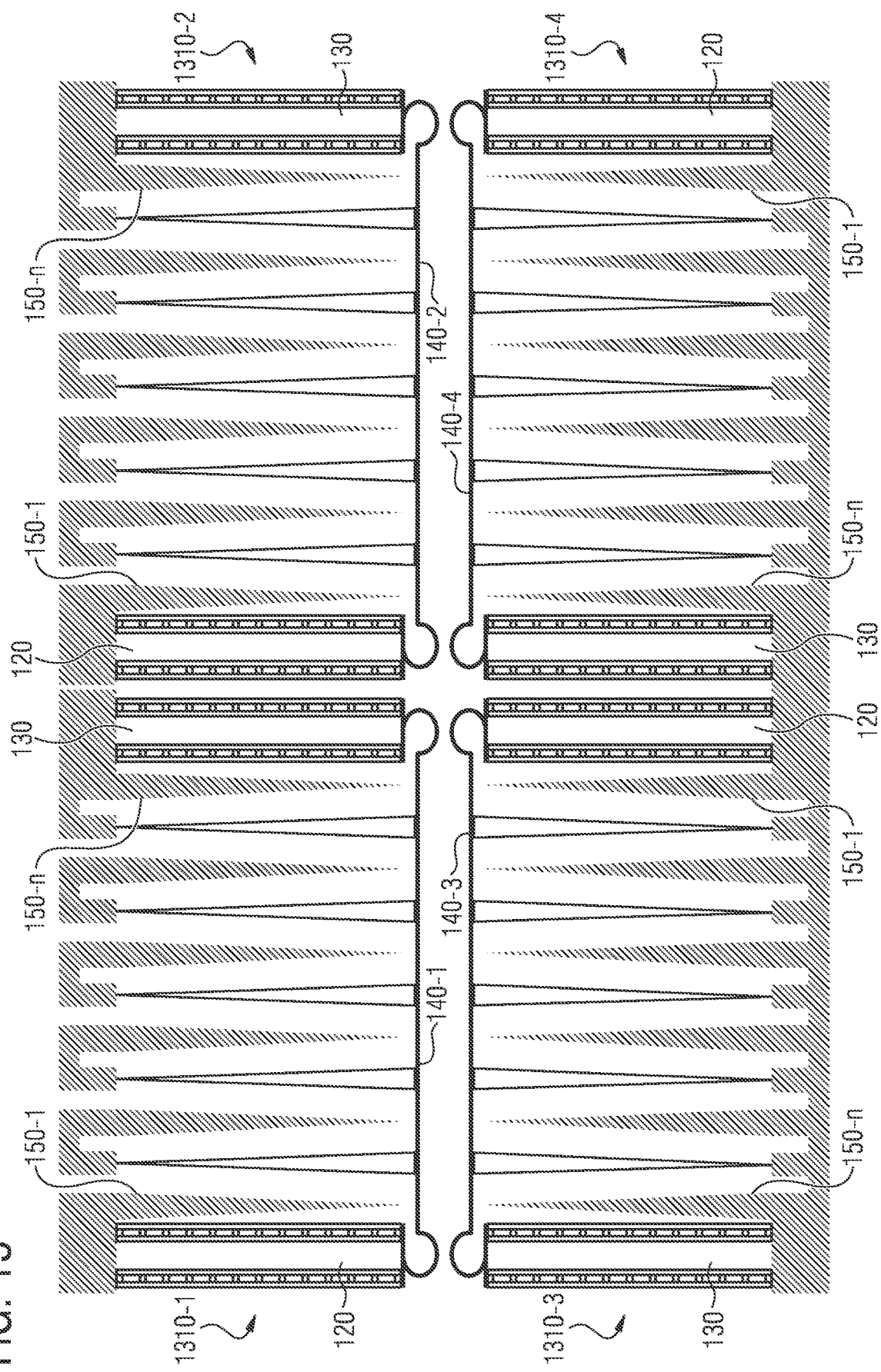

In FIG. 14, MEMS devices 1310-1, . . . , 1310-4 are arranged in two rows such that MEMS devices 1310-1 and 1310-2 are arranged in a first row and MEMS devices 1310-3 and 1310-4 are arranged in a second row. In this regard, MEMS devices 1310-3 and 1310-4 are arranged opposite MEMS devices 1310-1 and 1310-2 such that respective interconnect elements 140-3 and 140-4 of MEMS devices 1310-3 and 1310-4 face respective interconnect elements 140-1 and 140-2 of MEMS devices 1310-1 and 1310-2 and are spaced apart from each other. MEMS devices 1310-3 and 1310-4 are thus rotated 180° with respect to MEMS devices 1310-1 and 1310-2.

The distance between MEMS devices 1310-3 and 1310-4 and MEMS devices 1310-1 and 1310-2 can be, for example, between 1 and 200 µm, in particular 80 or 20 µm.

The openings 170 for a portion of the sub-cavities are formed in the substrate of the second layer, while the openings of the respective adjacent sub-cavities are formed in the third layer. It should be noted that this configuration of openings 170 and 180 is chosen purely as an example, and other configurations are also possible (e.g., openings 170 or openings 180 in the first layer).

It should also be noted that the number of first and second fingers in FIG. 14 is selected purely as an example and more or fewer fingers can also be used. To illustrate this, MEMS devices 1310-1, . . . , 1310-4 in FIG. 15 each have additional first fingers 150-1 and 150-n adjacent to laterally deflectable elements 120 and 130. In contrast to the embodiment illustrated in FIG. 15, the laterally deflectable elements 120 and 130 illustrated in FIG. 14 actively participate in the interaction with the ambient fluid.

Figure 16:
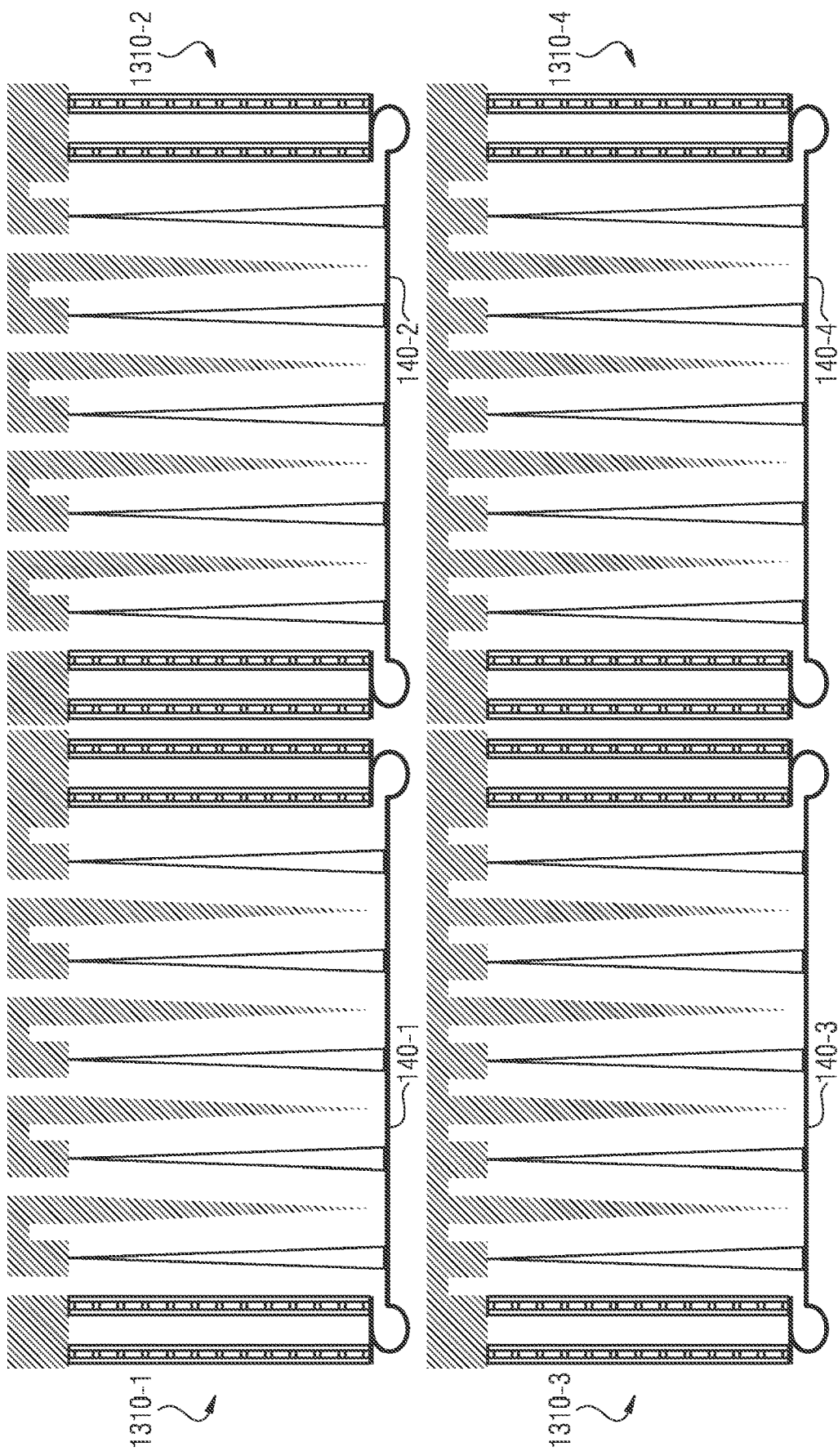
Figure 17:
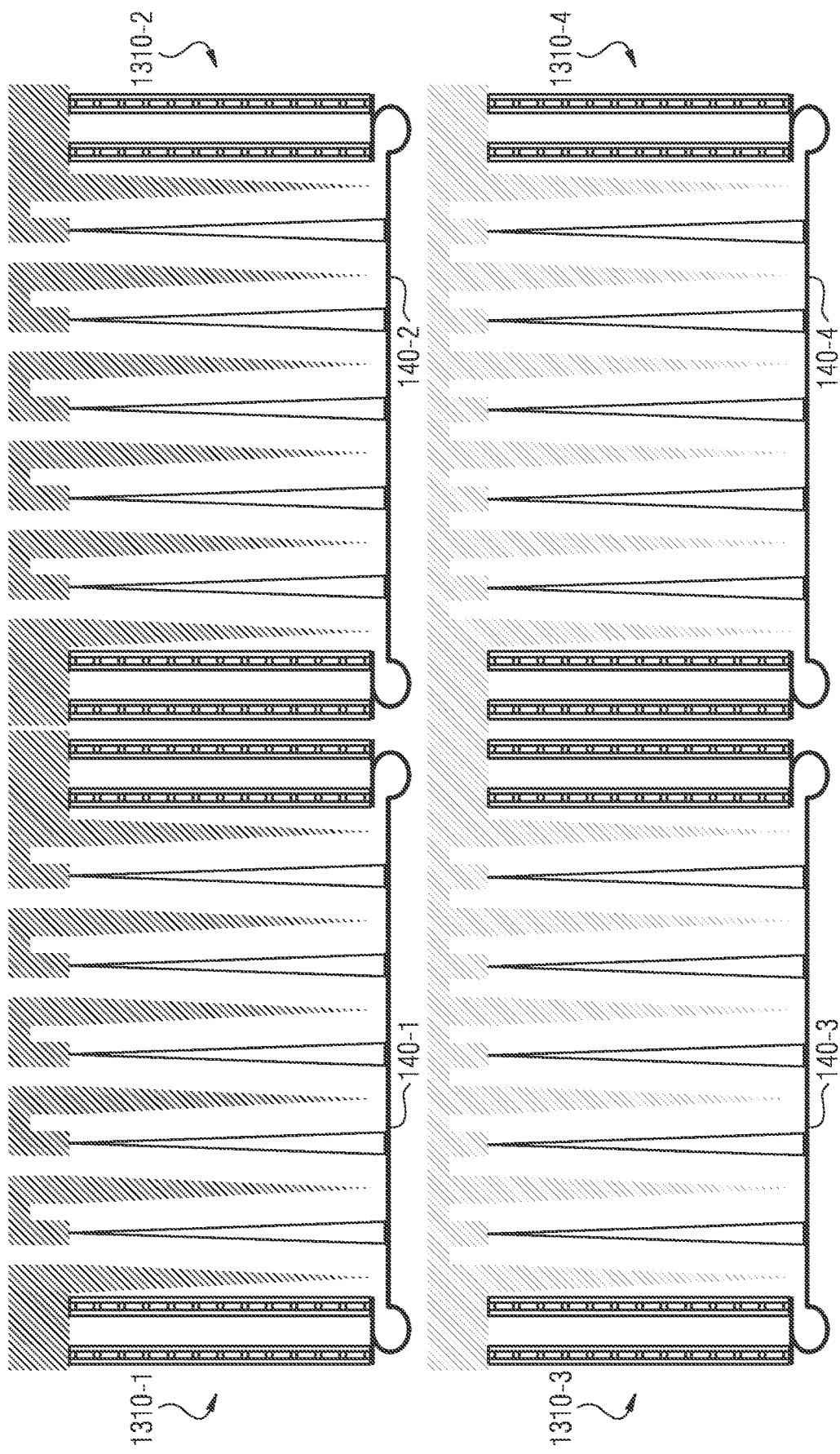

FIG. 16 illustrates a variation of the arrangement illustrated in FIG. 14, in which MEMS devices 1310-3 and 1310-4 have the same orientation as MEMS devices 1310-1 and 1310-2. FIG. 17 illustrates an analogous variation of the arrangement illustrated in FIG. 15. MEMS devices 1310-3 and 1310-4 are thus rotated by 0° relative to MEMS devices 1310-1 and 1310-2 in the embodiments of FIGS. 16 and 17. Accordingly, the respective interconnect elements 140-3 and 140-4 of the MEMS devices 1310-3 and 1310-4 do not face the respective interconnect elements 140-1 and 140-2 of the MEMS devices 1310-1 and 1310-2, but the interconnect elements 140-1 and 140-2 of the MEMS devices 1310-1 and 1310-2 face the substrate of the second layer of the MEMS devices 1310-3 and 1310-4.

According to embodiments, a first MEMS device of the plurality of MEMS devices may also be rotated relative to a second MEMS device of the plurality of MEMS devices by an angle different from 0° and 180°. For example, a first MEMS device may be rotated 90° or a different angle with respect to a second MEMS device of the plurality of MEMS devices. This can advantageously enable a high degree of surface utilization of an available component area.

Figure 18:
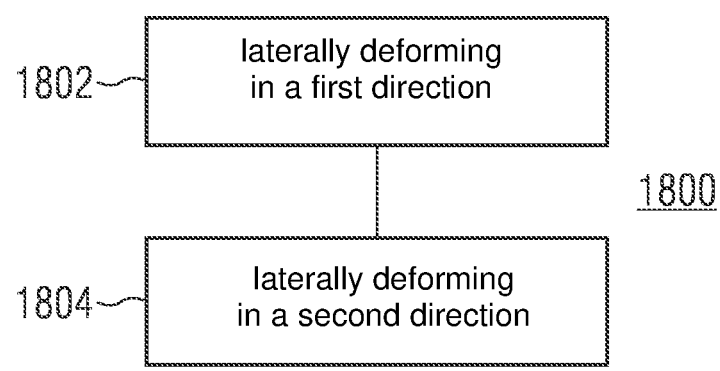
FIG. 18, illustrates a flowchart of a first embodiment of a method of operating a MEMS device.
Figure 19:
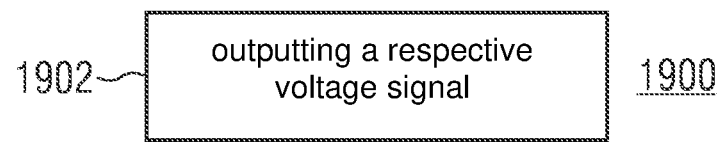
FIG. 19 illustrates a flowchart of a second embodiment of a method for operating a MEMS device.

To again summarize the aspects described above for operating the MEMS devices described herein, FIGS. 18 and 19 still illustrate flowcharts of two methods for operating the MEMS devices described herein.

FIG. 18 illustrates a flowchart of a first method 1800 for operating a MEMS device described herein. The method 1800 includes laterally deforming 1802 the two laterally deflectable elements in a first direction by applying a potential (e.g., a voltage signal) to increase a volume of one sub-cavity of the adjacent sub-cavities and decrease a volume of the other sub-cavity of the adjacent sub-cavities during a first time interval for influencing the ambient fluid. Further, the method 1800 comprises laterally deforming 1804 the two laterally deflectable elements in an opposite second direction by applying the potential to increase the volume of one sub-cavity of the adjacent sub-cavities and decrease the volume of the other sub-cavity of the adjacent sub-cavities during a second time interval for influencing the ambient fluid.

The method 1800 can provide controlled manipulation of the ambient fluid based on the applied potential. Due to the comb-like arrangement of the first and second fingers, the available area of the MEMS device can be used to a high degree for influencing the ambient fluid. Method 1800 can be used to operate the MEMS device as an actuator.

Further details and aspects of the method 1800 are described above in connection with further embodiments (e.g., FIGS. 1 to 12) described. The method 1800 may comprise one or more optional features according to the further embodiments.

FIG. 19 illustrates a flowchart of a second method 1900 for operating a MEMS device described herein, wherein the plurality of second fingers can laterally displace relative to the plurality of first fingers to adjust volumes of the adjacent sub-cavities depending on the ambient fluid while laterally deforming the two laterally deflectable elements. The method 1900 includes outputting 1902 a respective potential (e.g., a voltage signal) by the two laterally deflectable elements upon lateral deformation due to the application of external force by the displacement of the plurality of second fingers.

Due to the comb-like arrangement of the first and second fingers, the available area of the MEMS device can be used to a high degree for sensing the ambient fluid. Method 1900 can be used to operate the MEMS device as a sensor.

Further details and aspects of the method 1900 are described above in connection with further embodiments (e.g., FIGS. 1 to 12) described. The method 1900 may comprise one or more optional features according to the further embodiments.

Thus, embodiments of the present disclosure relate to, among other things:

A MEMS transducer system comprising a plurality of actively deformable elements and a plurality of passive elements connected to the active elements and disposed in the substrate layer of an at least three-layer stack.

A MEMS transducer system consisting of at least two discretely spaced unilaterally clamped NED actuators connected by a common comb back.

Embodiments in which a lateral deformation of unilaterally clamped bending transducers takes place based on an electric potential and, due to the connection of the actively deformable elements via the comb back, the movement is in the same direction.

Embodiments in which the fingers are connected to the back of the comb and together with the mating fingers, which are connected to the substrate, define the sub-cavities. Further limitations of the sub-cavities result from the comb back, the substrate, as well as lid and handling wafers.

Embodiments in which the sub-cavities are connected to the environment through openings in the substrate and/or in the lid and/or handling wafer. The openings can be located in the substrate and in the lid wafer. The openings can alternatively be arranged in the substrate and in the handling wafer. Furthermore, the openings may be located in the lid and handling wafer.

Embodiments in which the cross-section of the fingers is largest in the region of the junction with the ridge back and tapers towards its free end (angle α).

Embodiments in which the cross sections deviate from a square cross section. Oval, tapered or waisted cross-sections are possible, for example.

Embodiments in which the fingers are discretely spaced apart.

Embodiments in which the cross-section of the mating fingers is largest in the region of the connection to the frame and tapers toward its free end.

Embodiments in which the cross-sections of the fingers or mating fingers deviate from a square cross-section. Oval, tapered or waisted cross-sections are possible, for example.

Embodiments in which the mating fingers are discretely spaced apart. The distance can be, for example, between 0 and 100 μm, preferably 15 μm and particularly preferably 10 μm.

Embodiments in which the fingers overlap laterally by 65%, preferably 85%, and more preferably 95%.

The aspects and features described together with one or more of the previously detailed examples and figures may also be combined with one or more of the other examples to substitute for a like feature of the other example, or to additionally introduce the feature into the other example.

Through the description and drawings only the principles of the disclosure are presented. Further, all examples herein are generally intended to be expressly for illustrative purposes only, to assist the reader in understanding the principles of the disclosure and the concepts contributed by the inventors to the advancement of the art. All statements here about principles, aspects and examples of the revelation as well as concrete examples of the same include their correspondences.

Further, the following claims are hereby incorporated by reference in the detailed description, where each claim may stand alone as a separate example. While each claim may stand alone as a separate example, it should be noted that although a dependent claim may refer in the claims to a particular combination with one or more other claims, other examples may also include a combination of the dependent claim with the subject matter of any other dependent or independent claim. Such combinations are explicitly suggested here unless it is stated that a particular combination is not intended. Further, features of a claim for any other independent claim are also intended to be included, even if that claim is not made directly dependent on the independent claim.

The invention claimed is:

1. A MEMS device, comprising:
   a layer stack having at least one second layer formed between a first layer and a third layer, wherein a cavity is formed in the second layer;
   two laterally deflectable elements arranged laterally spaced apart in the cavity, each of the two laterally deflectable elements comprising a respective end connected to a side wall of the cavity;
   a connecting element connected to the two laterally deflectable elements to couple the movement of the two laterally deflectable elements;
   a plurality of first fingers arranged discretely spaced between the two laterally deflectable elements on the side wall of the cavity;
   a plurality of second fingers arranged discretely spaced between the two laterally deflectable elements on the connecting element and interdigitating with the plurality of first fingers, the plurality of second fingers being laterally displaceable relative to the plurality of first fingers upon deformation of the two laterally deflectable elements such that the plurality of first fingers and the plurality of second fingers define a plurality of volume variable sub-cavities within the cavity, wherein each of the plurality of sub-cavities is in contact with an ambient fluid of the MEMS device via a respective opening, and wherein, in case of adjacent sub-cavities of the plurality of sub-cavities, the respective opening of one sub-cavity of the adjacent sub-cavities is formed in a different layer of the first layer, the second layer and the third layer than the opening of the other sub-cavity of the adjacent sub-cavities.

2. The MEMS device of claim 1, wherein the opening of the one sub-cavity of the adjacent sub-cavities is formed in the second layer and the opening of the other sub-cavity of the adjacent sub-cavities is formed in the first layer or the second layer.

3. The MEMS device of claim 1, wherein the opening of the one sub-cavity of the adjacent sub-cavities is formed in the first layer and the opening of the other sub-cavity of the adjacent sub-cavities is formed in the third layer.

4. The MEMS device of claim 1, wherein the connecting element is connected to the two laterally deflectable elements via a respective flexible element, the flexible element exhibiting a lower stiffness than the connecting element and the two laterally deflectable elements.

5. The MEMS device of claim 1, wherein a cross-section of each of the plurality of first fingers decreases from an end of the respective first finger connected to the side wall of the cavity toward a free end of the respective first finger.

6. The MEMS device of claim 1, wherein a cross-section of each of the plurality of second fingers decreases from an end of the respective second finger connected to the connecting element toward a free end of the respective second finger.

7. The MEMS device of claim 1, wherein the plurality of first fingers and the plurality of second fingers overlap along their longitudinal extent by at least 65%.

8. The MEMS device of claim 1, wherein the plurality of first fingers and the plurality of second fingers overlap along a thickness direction of the second layer by at least 80%.

9. The MEMS device of claim 1, wherein a ratio of a lateral extent of a finger of the plurality of first fingers to its longitudinal extent is greater than a ratio of a lateral extent of a finger of the plurality of second fingers to its longitudinal extent.

10. The MEMS device of claim 1, wherein the respective lateral distance between the plurality of first fingers is 100 µm or less.

11. The MEMS device of claim 1, wherein a ratio of an extent of the plurality of first fingers and/or an extent of the plurality of second fingers along a thickness direction of the second layer to an extent of the two laterally deflectable elements along the thickness direction of the second layer is between 10% and 100%.

12. The MEMS device of claim 1, wherein an extent of the plurality of first fingers, the plurality of second fingers, and the two laterally deflectable elements along a thickness direction of the second layer is between 10 µm and 750 µm.

13. The MEMS device of claim 1, wherein the two laterally deflectable elements are configured to deform laterally upon application of a first potential such that the plurality of second fingers shift laterally with respect to the plurality of first fingers to alternately decrease and increase a volume of the one sub-cavity of the adjacent sub-cavities and, . . . conversely, alternately increase and decrease a volume of the other sub-cavity of the adjacent sub-cavities to influence the ambient fluid.

14. The MEMS device of claim 1, wherein the plurality of second fingers are laterally displaceable relative to the plurality of first fingers in order to adjust volumes of the adjacent sub-cavities depending on the ambient fluid by lateral deformation of the two laterally deflectable elements, and wherein the two laterally deflectable elements are configured to output a respective second potential in case of lateral deformation due to the external force exerted by the displacement of the plurality of second fingers.

15. The MEMS device of claim 1, wherein at least one of the two laterally deflectable elements comprises a first electrode layer and a second electrode layer between which a non-conductive layer is formed, wherein the laterally deflectable element is configured to:
    laterally deform upon application of a first voltage signal to the first electrode layer and the second electrode layer; and/or
    generate a second voltage signal at the first electrode layer and the second electrode layer upon lateral deformation due to an application of an external force.

16. The MEMS device of claim 1, wherein each of the two laterally deflectable elements further comprises a free end, and wherein the connecting element is connected to the free ends of the two laterally deflectable elements.

17. The MEMS device of claim 1, wherein each of the two laterally deflectable elements comprises a respective further end connected to a further sidewall of the cavity, the sidewall and the further sidewall being opposite to each other.

18. The MEMS device of claim 1, further comprising:
    two further laterally deflectable elements arranged laterally spaced apart in the cavity, each of the two further laterally deflectable elements comprising a respective end connected to a further side wall of the cavity, and wherein the connecting element is connected to the two further laterally deflectable elements;
    a plurality of third fingers arranged discretely spaced between the two further laterally deflectable elements on the further side wall of the cavity;
    a plurality of fourth fingers arranged discretely spaced between the two further laterally deflectable elements on the connecting element and interdigitating with the plurality of third fingers, the plurality of fourth fingers being laterally displaceable relative to the plurality of third fingers such that the plurality of third fingers and the plurality of fourth fingers define a further plurality of volume variable sub-cavities within the cavity,
    wherein each of the further plurality of sub-cavities is in contact with the ambient fluid via a respective opening, and wherein, in case of adjacent sub-cavities of the further plurality of sub-cavities, the opening of one sub-cavity of the adjacent sub-cavities is formed in a different layer of the first layer, the second layer and the third layer than the opening of the other sub-cavity of the adjacent sub-cavities.

19. An assembly, comprising:
    a plurality of MEMS devices according to claim 1; and
    a control circuit configured to provide at least a first potential to the laterally deflectable elements of at least a portion of the plurality of MEMS devices to operate the respective laterally deflectable elements as actuators to affect the ambient fluid; and/or
    a measurement circuit configured to measure second potentials of the respective laterally deflectable elements of at least a portion of the plurality of MEMS devices to operate the respective laterally deflectable elements as sensors for the ambient fluid.

20. The assembly of claim 19, wherein a first MEMS device of the plurality of MEMS devices is rotated relative to a second MEMS device of the plurality of MEMS devices by an angle different from 0° and 180°.

21. A method of operating a MEMS device according to claim 1, the method comprising:
   laterally deforming the two laterally deflectable elements in a first direction by applying a potential to decrease a volume of the one sub-cavity of the adjacent sub-cavities and increase a volume of the other sub-cavity of the adjacent sub-cavities during a first time interval for influencing the ambient fluid; and
   laterally deforming the two laterally deflectable elements in an opposite second direction by applying the potential to increase the volume of the one sub-cavity of the adjacent sub-cavities and decrease the volume of the other sub-cavity of the adjacent sub-cavities during a second time interval for influencing the ambient fluid.

22. A method of operating a MEMS device according to claim 1, wherein the plurality of second fingers are laterally displaceable relative to the plurality of first fingers to adjust volumes of the adjacent sub-cavities depending on the ambient fluid by lateral deformation of the two laterally displaceable elements, and wherein the method comprises:
   outputting a respective potential by the two laterally deflectable elements in case of lateral deformation due to the external force exerted by the displacement of the plurality of second fingers.

* * * * *